US 9,276,238 B2

(12) United States Patent
Shinotsuka et al.

(10) Patent No.: US 9,276,238 B2
(45) Date of Patent: Mar. 1, 2016

(54) ORGANIC LIGHT-EMITTING DIODE, ORGANIC LIGHT-EMITTING DIODE SUBSTRATE, AND METHOD OF MANUFACTURING SAME

(71) Applicant: Oji Holdings Corporation, Tokyo (JP)

(72) Inventors: Kei Shinotsuka, Tokyo (JP); Takayuki Okamoto, Tokyo (JP); Etsuko Kawamukai, Tokyo (JP); Norio Yamamura, Tokyo (JP)

(73) Assignee: OJI HOLDINGS CORPORATION, Tokyo (JP)

( * ) Notice: Subject to any disclaimer, the term of this patent is extended or adjusted under 35 U.S.C. 154(b) by 0 days.

(21) Appl. No.: 14/136,444

(22) Filed: Dec. 20, 2013

(65) Prior Publication Data

US 2014/0183497 A1 Jul. 3, 2014

(30) Foreign Application Priority Data

Dec. 28, 2012 (JP) ................................. 2012-288517

(51) Int. Cl.
*H01L 29/08* (2006.01)
*H01L 51/56* (2006.01)
(Continued)

(52) U.S. Cl.
CPC ............ *H01L 51/56* (2013.01); *H01L 51/0096* (2013.01); *H01L 51/5268* (2013.01); *Y02E 10/549* (2013.01)

(58) Field of Classification Search
CPC . H01L 51/0096; H01L 51/56; H01L 51/5268; Y02E 10/549
USPC ............................................. 257/40; 438/22
See application file for complete search history.

(56) References Cited

U.S. PATENT DOCUMENTS 7,221,093 B2 * 5/2007 Auch ................... H01L 27/3283
313/504
2007/0096636 A1 * 5/2007 Park ..................... H01L 27/3246
313/503
(Continued)

FOREIGN PATENT DOCUMENTS

JP A-2002-270891 9/2002
JP A-2004-031350 1/2004
(Continued)

OTHER PUBLICATIONS

Jing Feng1,a), Takayuki Okamoto1 and Satoshi Kawata1,b) Highly directional emission via coupled surface-plasmon tunneling from electroluminescence in organic light-emitting devices,Appl. Phys. Lett. 87, 241109 (2005).*

(Continued)

*Primary Examiner* — Vongsavanh Sengdara
(74) *Attorney, Agent, or Firm* — Knobbe Martens Olson & Bear LLP

(57) ABSTRACT

An organic light-emitting diode manufactured from an organic light-emitting diode substrate in which a concave-convex structure is provided in at least a part of the surface, in which the concave-convex structure is capable of obtaining an atomic force microscope (AFM) image in which a plurality of dots is dispersed when observed by an AFM. A histogram is created by measuring a diameter (nm) of each of the plurality of dots present in a randomly selected region having an area of 25 $\mu m^2$ on the atomic force microscope image, resulting in a plurality of peaks including one main peak and one or more sub-peaks, and the chromaticity of light emitted from the organic light-emitting diode is in a range of (x, y)=(0.28 to 0.50, 0.29 to 0.45) in a CIE standard colorimetric system.

11 Claims, 3 Drawing Sheets

(51) Int. Cl.
*H01L 51/00* (2006.01)
*H01L 51/52* (2006.01)

(56) References Cited

U.S. PATENT DOCUMENTS

2007/0285411 A1* 12/2007 Yang .................. H01L 27/3269
345/207
2011/0114931 A1* 5/2011 Lee ..................... H01L 51/5262
257/40

FOREIGN PATENT DOCUMENTS

| JP | A-2005-535121 | 11/2005 |
| JP | A-2009-158478 | 7/2009 |
| JP | A-2010-129301 | 6/2010 |
| JP | A-2010-527108 | 8/2010 |
| JP | A-2010-192366 | 9/2010 |
| JP | A-2011-524067 | 8/2011 |
| WO | WO 2004/013921 | 2/2004 |
| WO | WO 2008/140675 | 11/2008 |
| WO | WO 2009/148516 A1 | 12/2009 |
| WO | WO 2012/060404 A1 | 5/2012 |

OTHER PUBLICATIONS

Office Action in Japanese Patent Application No. 2012-288517, mailed Dec. 1, 2015.

* cited by examiner

ORGANIC LIGHT-EMITTING DIODE, ORGANIC LIGHT-EMITTING DIODE SUBSTRATE, AND METHOD OF MANUFACTURING SAME

CROSS REFERENCE TO RELATED APPLICATION

This application claims priority under 35 U.S.C. §119(a)-(d) to Japanese Patent Application No. 2012-288517, filed Dec. 28, 2012, the entire content of which is incorporated herein by reference.

BACKGROUND OF THE INVENTION

1. Field of the Invention

The present invention relates to an organic light-emitting diode, organic light-emitting diode substrate, and a method of manufacturing the same.

2. Description of Related Art

An organic light-emitting diode is a light-emitting element using organic electroluminescence (hereinafter, "electroluminescence" is abbreviated as "EL"). In general, the organic light-emitting diode has a configuration in which conductive layers (positive electrode conductive layer and negative electrode conductive layer) are provided on both surfaces of an EL layer, which includes a light-emitting layer containing an organic light-emitting material, respectively. As the EL layer, in addition to the light-emitting layer, an electron transport layer, a hole transport layer, and the like are provided as necessary. The organic light-emitting diode is largely classified into a bottom emission type in which a positive electrode conductive layer formed from a transparent conductive layer such as ITO, an EL layer, and a negative electrode conductive layer are sequentially formed on a transparent substrate such as a glass substrate, and light is extracted from a substrate side, a positive electrode top emission type in which a negative electrode conductive layer, an EL layer, and a positive electrode conductive layer are sequentially formed on a substrate, and light is extracted from a side opposite to a substrate side, a negative electrode top emission type in which a reflective layer formed from a metal, a positive electrode conductive layer formed from a transparent conductive material such as ITO, an EL layer, a transflective negative electrode conductive layer, and an auxiliary electrode layer formed from a transparent conductive layer are sequentially formed on a substrate, and light is extracted from a side opposite to a substrate side, and the like.

The organic light-emitting diode has advantages such as less viewing angle dependency, low power consumption, and very small thickness. On the other hand, there is a problem in that light extraction efficiency is low. The light extraction efficiency is a ratio of an amount of light, which radiates from a light extraction surface (for example, a substrate surface in the case of the bottom emission type) to the air, to an amount of light generated from the organic light-emitting material. For example, the light which is generated from the light-emitting layer radiates in all directions. Therefore, it enters a waveguide mode in which the majority of the light repeats total reflection at an interface between a plurality of layers, each having a different refractive index, and thus the light is converted into heat or radiates from a side surface while being guided between the layers. As a result, the light extraction efficiency decreases. In addition, the distance from the metal negative electrode conductive layer is small, and thus a part of near field light from the organic light-emitting material is converted into surface plasmon on the surface of the negative electrode and disappears. As a result, the light extraction efficiency decreases. The light extraction efficiency has an effect on brightness and the like of a display and an illuminating device which are provided with the organic light-emitting diode, and thus various methods have been examined for improvement thereof.

As a method of improving the light extraction efficiency, a method of using surface plasmon resonance is suggested. For example, Japanese Unexamined Patent Application, First Publication No. 2002-270891, Japanese Unexamined Patent Application, First Publication No. 2004-31350, Published Japanese Translation No. 2005-535121 of the PCT International Publication, and Japanese Unexamined Patent Application, First Publication No. 2009-158478 disclose methods of providing a one-dimensional or two-dimensional periodic microstructure on the surface of a metal layer (negative electrode conductive layer). The periodic microstructure formed on the surface of the metal layer functions as a diffraction lattice, and converts surface plasmon into propagation light on the surface of a negative electrode. According to this, energy that disappears as the surface plasmon is extracted as propagation light to the outside of an element, and thus the light extraction efficiency is improved.

Among these Patent Documents, Japanese Unexamined Patent Application, First Publication No. 2009-158478 discloses a method in which a substrate having a periodic lattice structure due to a concavity and convexity is prepared according to a dry etching method using a two-dimensional crystal body constituted by a particle single layer film as an etching mask, and a positive electrode conductive layer, a light-emitting layer, and a negative electrode conductive layer are sequentially laminated on the substrate. In the method, the periodic lattice structure on a substrate surface is sequentially transferred during lamination, and thus a periodic lattice structure having a shape copied from the periodic lattice structure of the substrate surface is formed on the surface of the negative electrode conductive layer on a light-emitting layer side.

SUMMARY OF THE INVENTION

Until now, the above-described periodic microstructure has been prepared in such a manner that a period of the concavity and convexity becomes constant. This is effective for improvement of the extraction efficiency of light having a specific wavelength if the period is constant, that is, if spacing of the concavity and convexity having the microstructure is constant. However, according to examination by the present inventors, it has been found that if the spacing of the concavity and convexity is constant, it is difficult to improve the extraction efficiency of light from a white light-emitting diode in which an extraction wavelength ranges over the entirety of a visible light region (380 nm to 780 nm).

The invention has been made in consideration of the above-described circumstances, and an object thereof is to provide an organic light-emitting diode capable of obtaining satisfactory color-developing light which is excellent in extraction efficiency of light of an arbitrary broadband wavelength region in a visible region and in which blueness or redness is reduced, an organic light-emitting diode substrate useful for manufacturing the organic light-emitting diode, and a method of manufacturing the organic light-emitting diode substrate.

The invention has the following aspects.

[1] An aspect of the invention is an organic light-emitting diode manufactured from an organic light-emitting diode substrate in which an concave-convex structure is provided in at least a part of the surface, wherein the concave-convex structure is a structure capable of obtaining an atomic force microscope image in which a plurality of dots are dispersed when observed by an atomic force microscope, when measuring a diameter (nm) of each of the plurality of dots present in a randomly selected region having an area of 25 µm² on the atomic force microscope image, obtaining a frequency distribution from the number of dots having a diameter corresponding to each of sections obtained by partitioning a diameter range for each 20 nm, calculating a total area of dots, which are present in each of the sections, from the frequency distribution, and creating a histogram in which the total area is shown in a Y-axis and the diameter of the dot is shown in an X-axis, the histogram has a plurality of peaks, the plurality of peaks include one main peak in which the total area of dots corresponding to a corresponding peak has a maximum value, and one or more sub-peaks in which the total area is 10% or more of the maximum value, and chromaticity of light emitted from the organic light-emitting diode is in a range of chromaticity coordinates (x, y)=(0.28 to 0.50, 0.29 to 0.45) in a CIE standard colorimetric system.

[2] The organic light-emitting diode according to [1], wherein among diameters of the respective main peak and sub-peaks, when a maximum diameter is set as A and a minimum diameter is set as B, A and B satisfy the following Expressions (1) to (3).

$$1.2B \leq A \leq 4B \quad (1)$$

$$100\ nm \leq A \leq 500\ nm \quad (2)$$

$$30\ nm \leq B \leq 300\ nm \quad (3)$$

[3] Another aspect of the invention is an organic light-emitting diode substrate in which a concave-convex structure is provided in at least a part of the surface, wherein the concave-convex structure is a structure capable of obtaining an atomic force microscope image in which a plurality of dots are dispersed when observed by an atomic force microscope, when measuring a diameter (nm) of each of the plurality of dots present in a randomly selected region having an area of 25 µm² on the atomic force microscope image, obtaining a frequency distribution from the number of dots having a diameter corresponding to each of sections obtained by partitioning a diameter range for each 20 nm, calculating a total area of dots, which are present in each of the sections, from the frequency distribution, and creating a histogram in which the total area is shown in a Y-axis and the diameter of the dot is shown in an X-axis, the histogram has a plurality of peaks, and the plurality of peaks include one main peak in which the total area of dots corresponding to a corresponding peak has a maximum value, and one or more sub-peaks in which the total area is 10% or more of the maximum value.

[4] Still another aspect of the invention is a method of manufacturing an organic light-emitting diode substrate in which a concave-convex structure is provided in at least a part of the surface, the method includes obtaining a particle mixture in which a particle size distribution has a plurality of peaks, disposing a particle single layer film formed from the particle mixture on at least a part of the surface of the substrate, and dry-etching the substrate by using the particle single layer film as an etching mask to form a concave-convex structure in at least a part of the surface of the substrate, wherein the plurality of peaks include one main peak in which an occupied area of particles corresponding to a corresponding peak has a maximum value, and one or more sub-peaks in which the occupied area is 10% or more of the maximum value.

[5] Still another aspect of the invention is a method of manufacturing an organic light-emitting diode substrate in which a concave-convex structure is provided in at least a part of the surface, the method includes obtaining a particle mixture in which a particle size distribution has a plurality of peaks, disposing a particle single layer film formed from the particle mixture on at least a part of the surface of a base material, dry-etching the base material by using the particle single layer film as an etching mask to form a concave-convex structure in at least a part of the surface of the base material, and transferring the concave-convex structure or a concave-convex structure which is formed by transferring the concave-convex structure onto another base material onto at least a part of the surface of the substrate, wherein the plurality of peaks include one main peak in which an occupied area of particles corresponding to a corresponding peak has a maximum value, and one or more sub-peaks in which the occupied area is 10% or more of the maximum value.

[6] The method of manufacturing an organic light-emitting diode substrate according to [5], wherein transferring of the concave-convex structure onto at least a part of the surface of the substrate is carried out according to a nano imprint method or an injection molding method.

[7] The method of manufacturing an organic light-emitting diode substrate according to any one of [4] to [6], wherein among particle sizes of the respective main peak and sub-peaks, when a maximum particle size is set as a and a minimum particle size is set as b, a and b satisfy the following Expressions (1') to (3'), respectively.

$$1.2b \leq a \leq 4b \quad (1')$$

$$100\ nm \leq a \leq 500\ nm \quad (2')$$

$$30\ nm \leq b \leq 300\ nm \quad (3')$$

[8] Still another aspect of the invention is an organic light-emitting diode including the organic light-emitting diode substrate manufactured according to the method of manufacturing an organic light-emitting diode substrate according to any one of [4] to [7].

According to the invention, it is possible to provide an organic light-emitting diode capable of obtaining satisfactory color-developing light which is excellent in extraction efficiency of light of an arbitrary broadband in a visible region and in which blueness or redness is reduced, an organic light-emitting diode substrate useful for manufacturing the organic light-emitting diode, and a method of manufacturing the organic light-emitting diode substrate.

DETAILED DESCRIPTION OF THE PREFERRED EMBODIMENTS

Organic Light-Emitting Diode Substrate

Figure 1:
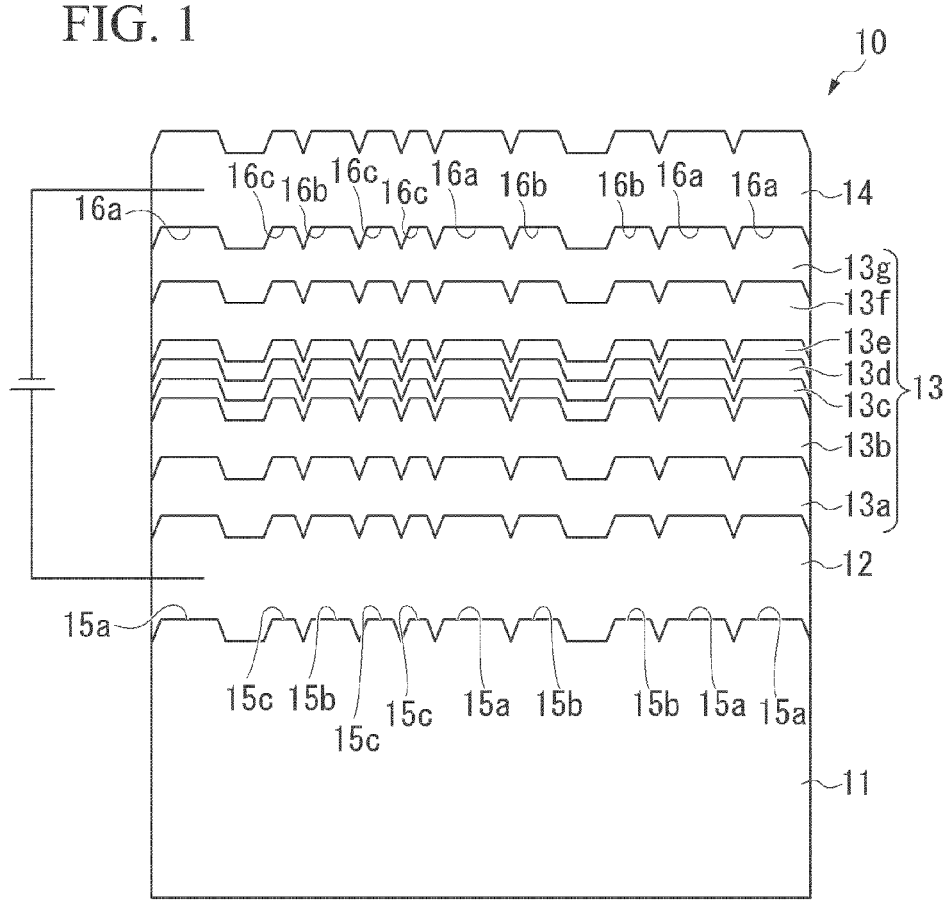
FIG. 1 is a schematic cross-sectional diagram illustrating a configuration of an organic light-emitting diode 10 according to a first embodiment of the invention.

First, an organic light-emitting diode substrate (hereinafter, simply referred to as a "substrate") of a first aspect of the invention will be described.

The substrate of this aspect is a substrate in which a concave-convex structure is provided in at least a part of the surface, wherein the concave-convex structure is a structure capable of obtaining an atomic force microscope (hereinafter, abbreviated as "AFM") image in which a plurality of dots are dispersed when observed by the AFM, when measuring a diameter (nm) of each of the plurality of dots present in a randomly selected region having an area of 25 μm² on the AFM image, obtaining a frequency distribution from the number of dots having a diameter corresponding to each of sections obtained by partitioning a diameter range for each 20 nm, calculating a total area of dots, which are present in each of the sections, from the frequency distribution, and creating a histogram in which the total area is shown in a Y-axis and the diameter of the dot is shown in an X-axis, the histogram has a plurality of peaks, the plurality of peaks include one main peak in which the total area of dots corresponding to a corresponding peak has a maximum value, and one or more sub-peaks in which the total area is 10% or more of the maximum value.

When carrying out image measurement using AFM with respect to a concave-convex structure of the substrate surface, the AFM image obtained includes height information (Z-axis position) in a horizontal position (X-axis position and Y-axis position) of the surface measured in addition to visual information.

In the AFM, a cross-sectional shape when being cut in a direction perpendicular to the substrate surface including a dot structure of a concave portion and a convex portion is observed. Specific examples of the cross-sectional shape include a convex portion having a truncated conical shape such as a truncated circular cone and a truncated polygonal cone, a conical shape such as a circular cone and a polygonal cone, a columnar shape, and the like, a concave portion having a shape obtained by inverting the convex portion, and the like, but it is not necessarily limited thereto as long as the gist of the invention is carried out.

That is, the concave-convex structure of the substrate surface is a structure in which a plurality of convex portions are two-dimensionally arranged or a structure in which a plurality of concave portions are two-dimensionally arranged. Examples of the substrate having the former concave-convex structure include a substrate 11 in an organic light-emitting diode 10 to be described later. Examples of the substrate having the latter concave-convex structure include a substrate 31 in an organic light-emitting diode 30 to be described later.

The term "two-dimensional arrangement" represents a state in which a plurality of convex portions or concave portions are arranged in the same plane. A distance between the centers of the plurality of convex portions or concave portions and an arrangement direction thereof may be constant or not constant. However, in this aspect, commonly, distribution of a plurality of dots (convex portions or concave portions) in an AFM image exhibits a state in which the distance between the centers of the respective dots and the arrangement thereof are random, not constant.

Specifically, the histogram may be obtained in the following sequence.

First, with respect to all of the plurality of dots present in a randomly selected region having an area of 25 μm² (5 μm×5 μm) on the ATM image, measurement of a diameter is carried out. Next, a diameter range (for example 30 nm to 510 nm) is partitioned for each 20 nm, and a frequency (a ratio (unit: %) of "the number of dots present in each section" to "the total number of dots that are measured") is obtained from the number of dots having a diameter corresponding to each section. From the result, a frequency distribution of the diameters of the dots may be obtained.

From the median value (for example, 40 nm in a case where the range is 30 nm to 50 nm) of the diameter of each section in the frequency distribution obtained and the number of dots present in each section, a total area (nm²) of dots present in each section is calculated by Expression: $\pi \times$(the median value/2)²×(the number of dots present in each section). From the result, a histogram in which the diameter of the dot is shown in the X-axis (horizontal axis) and the total area of each section is shown in the Y-axis (vertical axis) is created.

The diameter of the dot is a diameter of a conformal circle which is obtained from the AFM image.

In a case where the concave-convex structure of the substrate surface has a structure in which a plurality of concave portions are two-dimensionally arranged, the conformal circle is obtained by the following sequence.

When observing the concave-convex structure of the substrate surface in a direction (height direction) perpendicular to the substrate surface by the AFM, and paying attention to an arbitrary convex portion (hereinafter, referred to as a convex portion X0), other convex portions X1, X2, X3, ..., and Xn which are adjacent to surround the convex portion X0 are present. A saddle point of a saddle portion between X0 and X1 is set as x1, and similarly, saddle points of saddle portions with other convex portions are set as x2, x3, ..., xn, and a cross-section of the convex portion X0 at the highest height among the saddle points is obtained. A contour of the cross-section is set as L0, and a circle that least-square-conforms to the contour is drawn. This circle is defined as a conformal circle C0 that represents the magnitude of the convex portion X0.

Even when the concave-convex structure of the substrate surface is a structure in which a plurality of concave portions are two-dimensionally arranged, the conformal circle is obtained as described above.

The term "total area of dots corresponding to a corresponding peak" in each of the plurality of peaks of the histogram represents a total area of dots having a diameter in a range of a diameter of a peak top of a Gauss curve fitted to the corresponding peak ±2σ (σ represents a standard deviation). The total area is obtained by calculating an area in the range of the diameter of the peak top ±2σ (σ represents a standard deviation) in the Gauss curve by an integration method.

In a case where a plurality of peaks in which the total area has the maximum value are present, among the peaks, an arbitrary one is set as a main peak, and the others are set as sub-peaks. Accordingly, the frequency of the peak top of each of the sub-peaks is 10% to 100% of the maximum value.

In the histogram, a total number of the main peak and the sub-peaks is 2 or more, preferably 2 to 6, and still more preferably 2 to 4.

In the histogram, the peak in which the total area of dots corresponding to a corresponding peak has the maximum value is preferably one.

In addition, in the histogram, dots, in which a total area of the dots corresponding to a corresponding peak is less than 10% of the total area (maximum value) of dots corresponding to the main peak, are negligible when considering an effect of improving the extraction efficiency of light.

In the substrate of this aspect, among diameters in peak tops of the respective main peak and sub-peaks, when a maximum diameter is set as A and a minimum diameter is set as B, it is preferable that A and B satisfy the following Expressions (1) to (3).

$$1.2B \leq A \leq 4B \quad (1)$$

$$100 \text{ nm} \leq A \leq 500 \text{ nm} \quad (2)$$

$$30 \text{ nm} \leq B \leq 300 \text{ nm} \quad (3)$$

In this aspect, it is preferable to include 2 to 4 peaks in which diameters of respective peak tops as a main peak and sub-peaks, and a ratio of total areas of dots corresponding to the respective peaks satisfy any one of combinations expressed by the following Expressions (11) to (18) from the viewpoint that an effect of improving the light extraction efficiency in the organic light-emitting diode provided with the substrate is particularly significant.

$$250 \text{ nm}:150 \text{ nm}:90 \text{ nm}=1:1:1 \quad (11)$$

$$300 \text{ nm}:200 \text{ nm}:90 \text{ nm}=1:1:1 \quad (12)$$

$$350 \text{ nm}:250 \text{ nm}:200 \text{ nm}=1:1:1 \quad (13)$$

$$250 \text{ nm}:200 \text{ nm}:90 \text{ nm}=1:1:1 \quad (14)$$

$$200 \text{ nm}:150 \text{ nm}:90 \text{ nm}=1:1:1 \quad (15)$$

$$150 \text{ nm}:90 \text{ nm}=1:1 \quad (16)$$

$$200 \text{ nm}:90 \text{ nm}=1:1 \quad (17)$$

$$300 \text{ nm}:250 \text{ nm}:200 \text{ nm}:90 \text{ nm}=1:1:1:1 \quad (18)$$

Provided that, in each Expression, a variation of the diameter is permitted in a range of ±20 nm, and a variation of the ratio of the total areas of dots corresponding to the respective peaks is permitted in a range of ±30%. If the variations are in these ranges, a sufficiently significant effect may be obtained.

It is preferable that the shape of the plurality of dots present in the AFM image be isotropic.

It is possible to determine whether or not the shape of dots is isotropic by the following sequence.

First, the conformal circle $C_0$ is obtained in the following sequence. A standard deviation of a distance between the center of the conformal circle $C_0$ and the contour $L_0$ is obtained. When a variation coefficient value obtained by dividing the standard deviation by a radius of the conformal circle $C_0$ is 0.3 or less (30% or less), it can be said that the shape of the corresponding convex portion $X_0$ is isotropic with respect to an in-plane direction of the substrate.

An average height of the concave-convex structure (average height of a plurality of convex portions, or average depth of a plurality of concave portions) is preferably 15 nm to 200 nm, and more preferably 20 nm to 150 nm.

If the average height is in the above-described range, the effect of improving the extraction efficiency of light is excellent. On the other hand, if the average height is less than 15 nm, it is difficult to generate diffraction waves of surface plasmon which is sufficient as a two-dimensional concave-convex structure, and thus there is a concern that an effect of extracting the surface plasmon as radiant light decreases. If the average height exceeds 200 nm, when laminating other layers (a positive electrode conductive layer, an EL layer, a negative electrode conductive layer, and the like), which constitute the organic light-emitting diode, on the concave-convex structure during manufacturing of the organic light-emitting diode, the concavity and convexity becomes rough, and thus there is high possibility that the positive electrode conductive layer and the negative electrode conductive layer are short-circuited.

The average height of the concave-convex structure is measured by the AFM.

Specifically, for example, in a case where the concave-convex structure of the substrate surface is a structure in which a plurality of convex portions are two-dimensionally arranged, first, an AFM image is obtained with respect to one region of 25 μm² (5 μm×5 μm) which is randomly selected in the concave-convex structure. Next, a line is drawn in a diagonal direction of the AFM image, and the heights of each of the plurality of convex portions that intersect the line are measured. An average value is obtained from the resultant measurement values. This process is carried out with respect to a total of 25 regions of 5 μm×5 μm which are randomly selected in the same manner to obtain an average value of the convex portions in each of the regions. A value obtained by further averaging the average values of the 25 regions which are obtained in this manner is set as an average height of the convex portions.

The height of one convex portion is obtained as follows. Attention is paid to the convex portion $X_0$ in the AFM image to obtain saddle points $x_1$, $x_2$, $x_3$, . . . , and $x_n$ of saddle portions with other convex portions, and the height is obtained as a difference between an average height of these saddle points and a height of the center of the convex portion $X_0$.

Even in a case in which the concave-convex structure in the substrate surface is a structure in which a plurality of concave portions are two-dimensionally arranged, an average height (average depth of concave portions) is obtained in this manner.

For example, the average height of the concave-convex structure can be adjusted according to dry etching conditions when carrying out dry etching using a particle single layer film as an etching mask in the following method (A) or (B) of manufacturing a substrate, and resin shape transferring conditions during nano imprinting or injection molding relating to the method (B).

A material that constitutes the substrate of this aspect is appropriately set in consideration of a structure, strength, a manufacturing method, and the like of the organic light-emitting diode to which the substrate is applied.

For example, in a case of a bottom emission type organic light-emitting diode, as the substrate, a transparent substrate is used.

A material that constitutes the transparent substrate is not particularly limited as long as the material is capable of transmitting light of a target extraction wavelength, and the material may be an inorganic material, an organic material, or a combination of these. Examples of the inorganic material include various kinds of glass such as quartz glass, alkali-free glass, white sheet glass, transparent inorganic mineral such as mica, and the like. Examples of the organic material include a resin film such as a cycloolefin-based film and a polyester-based film, a fiber reinforced plastic material obtained by mixing a microfiber such as a cellulose nanofiber in the resin film, and the like.

Although also depending on a use, as the transparent substrate, a substrate having a high visible-light transmittance is generally used. With regard to the visible-light transmittance, 70% or more is preferable from the viewpoint of not giving deflection to a spectrum in a visible light region (wavelength of 380 nm to 780 nm), more preferably 80% or more, and still more preferably 90% or more.

For example, in a case of the positive electrode top emission type organic light-emitting diode or the negative electrode top emission type organic light-emitting diode, it is not necessary for the substrate to be a transparent substrate, and a substrate formed from an arbitrary material including an opaque metal material and the like may be used.

In a case of manufacturing the substrate of this aspect by disposing a particle single layer film on the surface of the substrate and carrying out dry etching, as the material of the substrate, a material capable of being dry-etched is used.

The substrate of this aspect is preferably manufactured by using a dry etching method in which the particle single layer film is used as an etching mask. The method of manufacturing the substrate of this aspect by using the dry etching method in which the particle single layer film is used as the etching mask will be described later in detail, but a shape of a plurality of dots on an AFM image of a concave-convex structure formed by the method reflects the shape of a plurality of particles, which constitute the particle single layer film, and is isotropic. In addition, diameters of the plurality of dots are substantially equal to particle sizes of the plurality of particles that constitute the particle single layer film, respectively.

As the method of manufacturing the substrate of this aspect by using the dry etching method in which the particle single layer film is used as the etching mask, for example, the following manufacturing method (A) or (B) may be exemplified.

Operational Effect

According to the substrate of this aspect, when manufacturing the organic light-emitting diode by forming other layers (a positive electrode conductive layer, an EL layer, a negative electrode conductive layer, and the like) that constitute the organic light-emitting diode on the surface in which the concave-convex structure is provided, respectively, the organic light-emitting diode obtained can efficiently extract light of a broadband (for example, a part or the entirety of light of the entire visible light region (380 nm to 780 nm)), and thus satisfactory color-developing light in which blueness and redness is reduced may be obtained.

Details will be described later, but among the other layers that constitute the organic light-emitting diode, any one of the positive electrode conductive layer and the negative electrode conductive layer includes a metal layer. When forming the positive electrode conductive layer, the EL layer, the negative electrode conductive layer, and the like on the surface of the substrate, in which the concave-convex structure is provided, in this order or in a reversed order, the respective layers that are formed have the same concave-convex structure as the concave-convex structure provided to the substrate in the surface on a side opposite to a substrate side, and have a concave-convex structure (inverted concave-convex structure), which has a shape inverted from the concave-convex structure provided to the substrate, in the surface on the substrate side.

The inverted concave-convex structure is a structure capable of obtaining an image in which a plurality of dot-type concave portions are dispersed when observed by the AFM. When measuring a diameter (nm) of each of the plurality of dot-type concave portions present in a randomly selected region having an area of 25 $\mu m^2$ on the AFM image, obtaining a frequency distribution from the number of dot-type concave portions having a diameter corresponding to each of sections obtained by partitioning a diameter range for each 20 nm, calculating a total area of the dot-type concave portions, which are present in each of the sections, from the frequency distribution, and creating a histogram in which the total area is shown in a Y-axis and the diameter of the dot-type concave portion is shown in an X-axis, the histogram has a plurality of peaks. The plurality of peaks include one main peak in which the total area of dot-type concave portions corresponding to a corresponding peak has a maximum value, and one or more sub-peaks in which the total area is 10% or more of the maximum value.

As described above, the organic light-emitting diode ultimately obtained is provided with a metal layer having the concave-convex structure or inverted concave-convex structure in at least a part of the surface which comes into contact with the EL layer.

The concave-convex structure or inverted concave-convex structure of the surface of the metal layer functions as a diffraction lattice that converts surface plasmon into light, and energy that disappears as the surface plasmon is extracted as light, and thus light extraction efficiency is improved.

That is, propagation type surface plasmon on a metal surface represents compression waves of free electrons accompanied with the surface electromagnetic field. In a case of surface plasmon present on a flat metal surface, a dispersion curve of the surface plasmon and a dispersion straight line of spatial propagation light do not intersect each other, and thus the surface plasmon cannot be extracted as light. On the contrary, a fine concave-convex structure in a nanometer order is present in the metal surface, the dispersion curve of the spatial propagation light diffracted by the concave-convex structure intersects the dispersion curve of the surface plasmon, and thus energy of the surface plasmon can be extracted as radiant light.

Accordingly, when the concave-convex structure is provided in the surface of the metal layer on an EL layer side, the energy of light that disappears as the surface plasmon is efficiently extracted. The extracted energy is radiated as radiant light from the surface of the metal layer. The radiant light is highly directional, and thus the majority thereof faces an extraction surface (the surface of the organic light-emitting diode on a substrate side or the opposite surface). Accordingly, high-intensity light is emitted from the extraction surface, and thus the extraction efficiency is improved.

On the other hand, even when the concave-convex structure is provided in the substrate surface, in a case where the width of the main peak is narrow and the sub-peaks are not present, in the organic light-emitting diode obtained, although the extraction efficiency of light having an arbitrary wavelength is improved, extraction efficiency of light of another wavelength is poor, and thus it is difficult to efficiently extract light of a broadband.

In addition, in the entirety of the substrate surface, when a concave-convex structure having a narrow spacing is great, or a concave-convex structure having a broad spacing is great, although the organic light-emitting diode obtained can extract light of a certain wavelength region, color-developing light has high blueness or redness.

For example, in Japanese Unexamined Patent Application, First Publication No. 2009-158478 described above, a particle single layer film in which a deviation in arrangement is less is formed by using particles having a single particle size, and a substrate having a lattice structure is prepared according to a dry etching method in which the particle single layer film is used as an etching mask, thereby forming a lattice structure in the surface of the metal layer on a light-emitting layer side.

The lattice structure has high periodicity, and thus a variation in a diameter of dots on the AFM image is substantially not observed. Accordingly, a sub-peak in which the frequency of the peak top is 5% or more of the maximum value is not present.

Method of Manufacturing Substrate

The substrate according to the first aspect of the invention can be manufactured by a dry etching method in which a particle single layer film which is formed using a particle mixture in which a particle size distribution has a plurality of peaks is used as an etching mask. For example, the substrate can be manufactured by the following manufacturing method (A) or (B).

Manufacturing Method (A)

The manufacturing method (A) is a method of manufacturing an organic light-emitting diode substrate, the method including:

a process of obtaining a particle mixture in which a particle size distribution has a plurality of peaks;

a process of disposing a particle single layer film formed from the particle mixture on at least a part of the surface of the substrate; and a process of dry-etching the substrate by using the particle single layer film as an etching mask to form a concave-convex structure in at least a part of the surface of the substrate, wherein the plurality of peaks include one main peak in which an occupied area of particles corresponding to a corresponding peak has a maximum value, and one or more sub-peaks in which the occupied area is 10% or more of the maximum value.

Manufacturing Method (B):

The manufacturing method (B) is a method of manufacturing an organic light-emitting diode substrate, the method including:

a process of obtaining a particle mixture in which a particle size distribution has a plurality of peaks;

a process of disposing a particle single layer film formed from the particle mixture on at least a part of the surface of a base material;

a process of dry-etching the base material by using the particle single layer film as an etching mask to form a concave-convex structure in at least a part of the surface of the base material; and a process of transferring the concave-convex structure or a concave-convex structure which is formed by transferring the concave-convex structure onto another base material onto at least a part of the substrate, wherein the plurality of peaks include one main peak in which an occupied area of particles corresponding to a corresponding peak has a maximum value, and one or more sub-peaks in which the occupied area is 10% or more of the maximum value.

The dry etching method in which the particle single layer film is used as the etching mask is a method in which a single layer film of particles is prepared on a substrate surface by using a principle of Langmuir Blodgett method (hereinafter, also referred to as an "LB" method), and the substrate surface is dry-etched using the single layer film as an etching mask to form the concave-convex structure. For example, the dry etching method is disclosed in detail in Japanese Unexamined Patent Application, First Publication No. 2009-158478.

In the manufacturing method (A), when the particle single layer film is disposed on the surface of the substrate, and the substrate is dry-etched using the particle single layer film as an etching mask, a concave-convex structure is formed in which a plurality of convex portions are two-dimensionally arranged on the surface of the substrate at a position in which the particle single layer film is disposed. The convex portions have a shape such as a circular conical shape, a truncated circular conical shape, and a circular columnar shape.

In the manufacturing method (B), when the particle single layer film is disposed on the surface of the base material, and the base material is dry-etched using the particle single layer film as an etching mask, a concave-convex structure is formed in which a plurality of convex portions are two-dimensionally arranged on the surface of the base material at a position in which the particle signal layer film is disposed. The convex portions have a shape such as a circular conical shape, a truncated circular conical shape, and a circular columnar shape.

When the base material in which the concave-convex structure is formed is used as a mold, and the concave-convex structure of the mold is directly transferred onto the surface of the substrate, a concave-convex structure in which a plurality of concave portions are two-dimensionally arranged is formed. The plurality of concave portions have a shape in which the plurality of convex portions in the concave-convex structure of the mold are inverted, respectively.

When a concave-convex structure of an intermediate transfer body which is obtained by transferring the concave-convex structure of the mold onto another base material for an odd number of times is transferred onto the surface of the substrate, a concave-convex structure in which a plurality of convex portions are two-dimensionally arranged is formed. The plurality of convex portions have the same shape as the plurality of convex portions in the concave-convex structure of the mold, respectively.

When the concave-convex structure which is obtained by transferring the concave-convex structure of the mold onto another base material for an even number of times is transferred onto the surface of the substrate, a concave-convex structure in which a plurality of concave portions are two-dimensionally arranged is formed. The plurality of concave portions have a shape in which the plurality of convex portions in the concave-convex structure of the mold are inverted, respectively.

In the particle mixture which is used in the manufacturing methods (A) and (B) and for formation of the particle single layer film, a particle size distribution has a plurality of peaks, and the plurality of peaks include one main peak in which an occupied area of particles corresponding to a corresponding peak has a maximum value, and one or more sub-peaks in which the occupied area is 10% or more of the maximum value.

Similar to the concave-convex structure in the substrate according to the above-described first aspect, the concave-convex structure formed using the particle single layer film is a structure capable of obtaining an AFM image in which a plurality of dots are dispersed when observed by the AFM. When measuring a diameter (nm) of each of the plurality of dots present in a randomly selected region having an area of 25 $\mu m^2$ on the AFM image, obtaining a frequency distribution from the number of dots having a diameter corresponding to each of sections obtained by partitioning a diameter range for each 20 nm, calculating a total area of dots, which are present in each of the sections, from the frequency distribution, and creating a histogram in which the total area is shown in a Y-axis and the diameter of the dot is shown in an X-axis, the histogram has a plurality of peaks.

A shape of the particle size distribution of the particle mixture and a shape of the frequency distribution in the concave-convex structure obtained by using the particle mixture substantially correspond to each other.

In an organic light-emitting diode manufactured using the substrate, the extraction efficiency of light of an arbitrary broadband in a visible region is dramatically improved, and satisfactory color-developing light in which blueness or redness is reduced may be obtained.

On the other hand, in the method of the related art which is disclosed in Japanese Unexamined Patent Application, First Publication No. 2009-158478, to obtain a two-dimensional closest packing lattice in which control of a particle spacing is carried out with high accuracy, particles having a single particle size are used. That is, in the particle single layer film formed using particles having a single particle size, the particles are two-dimensionally close-packed, and thus when the surface of an original plate of the substrate is dry-etched using the particle single layer film as an etching mask, a two-dimensional lattice structure having a high-accuracy triangular lattice (hexagonal lattice) shape is formed as the concave-convex structure. The two-dimensional lattice structure in the surface of a negative electrode conductive layer which is formed using the substrate having the two-dimensional lattice structure has high accuracy. Accordingly, when the substrate is used, even in a case of a large area, diffraction waves of surface plasmon can be obtained with high efficiency, and thus the light extraction efficiency is improved. As a result, it is considered that a high-luminance organic light-emitting diode can be obtained.

However, in the organic light-emitting diode manufactured according to the method of the related art, optimization is made to improve the extraction efficiency of light of a specific wavelength, and thus it is difficult to improve the extraction efficiency of light of a broadband.

The particle size distribution of the particle mixture is a frequency distribution of each particle size which is obtained by measuring particle mixture slurry according to a dynamic scattering method. The frequency (%) is a value on the basis of a number.

The frequency of a peak and the particle size represent a frequency of a peak top of a Gauss curve and a particle size which are fitted to the peak of the particle size distribution.

An area of particles represents an area occupied by the particles on the substrate (or base material). Specifically, when the particles are disposed on the substrate (or base material), the area of the particles corresponds to an area of the substrate (or base material) covered by the particles when viewed from an immediately upper side of the substrate.

The "occupied area of particles corresponding to a corresponding peak" is obtained by the following sequence.

First, a diameter range of a particle mixture which is measured by the AFM is partitioned for each 20 nm, and a histogram of a frequency is obtained from the number of particles having a particle size corresponding to each section. From a median value of the particle size in each section and the frequency (%) of particles present in each section, an area ratio of particles present in each section (ratio of "total area on a substrate which is occupied by particles present in each section" to "sum of areas (total area) on the substrate which are occupied by the entirety of particles") is calculated by Expression: $\pi \times$(the median value/2)$^2 \times$frequency. From the result, a histogram of an area in which the particle size is shown in an X-axis (horizontal axis) and the area ratio of particles for each section is shown in a Y-axis (vertical axis) is created.

Next, a Gauss curve is fitted with respect to each of the plurality of peaks of the histogram of the area. An area in a range of a particle size of a peak top of each Gauss curve $\pm 2\sigma$ ($\sigma$ represents a standard deviation) is set as an occupied area of particles corresponding to each peak. The occupied area is obtained by calculating an area in the range of the diameter of the peak top $\pm 2\sigma$ ($\sigma$ represents a standard deviation) in the Gauss curve by an integration method.

The one main peak in which the frequency of the peak top has the maximum value represents a peak, in which the maximum value is the largest, among the plurality of peaks having the particle size distribution.

In a case where a plurality of peaks in which the maximum value is the largest are present, an arbitrary one of the peaks is set as the main peak, and the others are set as sub-peaks. Accordingly, the frequency of the peak top of the sub-peaks is 10% to 100% of the maximum value.

In the particle size distribution, a total number of the main peak and the sub-peaks is 2 or more, more preferably 2 to 6, and still more preferably 2 to 4.

In the frequency distribution, the peak in which the frequency of the peak top has the maximum value in the particle size distribution is preferably one.

In addition, in the particle size distribution, dots in which the frequency of the peak top is less than 10% of the maximum value do not contribute to improvement of the extraction efficiency of light.

In the manufacturing method (A) or (B), among particle sizes in respective peak tops of the main peak and the sub-peaks, when the maximum particle size is set as a and the minimum value is set as b, it is preferable that a and b satisfy the following Expressions (1') to (3'), respectively.

$$1.2b \leq a \leq 4b \tag{1'}$$

$$100 \text{ nm} \leq a \leq 500 \text{ nm} \tag{2'}$$

$$30 \text{ nm} \leq b \leq 300 \text{ nm} \tag{3'}$$

Manufacturing Method (A)

The manufacturing method (A) includes a process (hereinafter, referred to as "A-1 process") of obtaining a particle mixture in which a particle size distribution has a plurality of peaks, a process (hereinafter, referred to as "A-2 process") of disposing a particle single layer film formed from the particle mixture on at least a part of the surface of the substrate, and a process (hereinafter, referred to as "A-3 process") of dry-etching the substrate by using the particle single layer film as an etching mask to form a concave-convex structure in at least a part of the surface of the substrate.

A-1 Process

The particle mixture in which a particle size distribution has a plurality of peaks may be obtained, for example, by preparing plural kinds of particles having average particle sizes different from each other and mixing these particles.

At this time, the particle size and frequency of each peak top of the plurality of peaks in the particle size distribution, an occupied area of particles corresponding to each peak, and the like may be adjusted by adjusting the number of kinds of particles that are mixed-in, an average particle size of each of the particles, a mixing ratio, and the like.

For example, although also depending on the mixing radio, typically, the number of kinds of particles that are mixed-in equals a total number of the main peak and the sub-peaks. An average particle size of each of the plurality of particles that are mixed-in is substantially equal to a particle size of each peak top of the plurality of peaks. Although also depending on a variation coefficient of the particle size, a mixing ratio on the basis of each of the numbers of particles that are mixed-in has a tendency to be proportional to a ratio of the frequency of each peak top of the plurality of peaks.

In the manufacturing method (A), it is preferable to carry out the A-1 process so as to include 2 to 4 peaks in which the particle sizes in respective peak tops of the plurality of peaks and the ratio of occupied areas of particles corresponding to the respective peaks satisfy, for example, any one of combinations expressed by the following Expressions (11') to (18') from the viewpoint that an effect of improving the light extraction efficiency in the organic light-emitting diode provided with the substrate is particularly significant.

$$250 \text{ nm}:150 \text{ nm}:90 \text{ nm}=1:1:1 \tag{11}$$

$$300 \text{ nm}:200 \text{ nm}:90 \text{ nm}=1:1:1 \tag{12}$$

$$350 \text{ nm}:250 \text{ nm}:200 \text{ nm}=1:1:1 \tag{13}$$

$$250 \text{ nm}:200 \text{ nm}:90 \text{ nm}=1:1:1 \tag{14}$$

$$200 \text{ nm}:150 \text{ nm}:90 \text{ nm}=1:1:1 \tag{15}$$

$$150 \text{ nm}:90 \text{ nm}=1:1 \quad (16)$$

$$200 \text{ nm}:90 \text{ nm}=1:1 \quad (17)$$

$$300 \text{ nm}:250 \text{ nm}:200 \text{ nm}:90 \text{ nm}=1:1:1:1 \quad (18')$$

Provided that, in each Expression, a variation of the particle size is permitted in a range of ±20 nm, and a variation of the ratio of the occupied areas of particles corresponding to the respective peaks is permitted in a range of ±30%. If the variations are in these ranges, a sufficiently significant effect may be obtained.

A method of mixing plural kinds of particles is not particularly limited, but preferred examples thereof include a method of mixing a plurality of particles which have a hydrophobic surface and have particle sizes different from each other and an organic solvent to prepare a dispersion liquid in which a particle mixture is dispersed in the organic solvent.

The dispersion liquid obtained by the method may be used as is in the A-2 process. Although details will be described later, examples of a method of carrying out the A-2 process include a method of sequentially carrying out a process of applying a liquid (lower layer liquid) that develops the particle mixture on a liquid surface thereof in a water tank, adding the dispersion liquid dropwise onto the liquid surface of the lower layer liquid, and vaporizing the organic solvent to form a particle single layer film formed from the particle mixture on the liquid surface (a particle single layer film-forming process), and a process of moving the particle single layer film onto an original plate (transition process). The dispersion liquid prepared may be used as a dispersion liquid in the method.

In this case, as the lower layer liquid, a hydrophilic liquid is used in order for the particles having a hydrophobic surface not to enter the underside of the liquid surface. In addition, as the organic solvent, a hydrophobic solvent is selected in order for the dispersion liquid to be developed to a gas-liquid interface between air and the lower layer liquid without being mixed with the lower layer liquid when developing the dispersion liquid.

In addition, the original plate represents a substrate before forming the concave-convex structure on the surface thereof. This is true of the following description.

When preparing the dispersion liquid, first, plural kinds of particles which have a hydrophobic surface and have average particle sizes different from each other are prepared, and a dispersion liquid is prepared in which these particles are dispersed in an organic solvent (for example, chloroform, methanol, ethanol, methyl ethyl ketone, methyl isobutyl ketone, hexane, and the like) having high volatility and high hydrophobicity.

The particles having particle sizes different from each other may be two or more kinds of particles. For example, particles having 2 to 40 kinds of particle sizes may be used. From the viewpoint of equalization of the effect of improving the extraction efficiency in a broadband, plural kinds are preferable.

All of the particle sizes of the plural kinds of particles are preferably in a range of 10 nm to 2000 nm, and more preferably in a range of 50 nm to 1700 nm.

A variation coefficient of the particle size of each of the plural kinds of particles is preferably 0% to 20%, and more preferably 0% to 10%.

A difference in the average particle size between the plural kinds of particles is preferably 50 nm or more, and more preferably 100 nm or more.

The particle size of the particles is a primary particle size. The particle size of the particles and the variation coefficient of the particle size can be obtained by a usual method from peaks obtained by fitting a particle size distribution obtained by a dynamic scattering method to a Gauss curve.

The material of the plural kinds of particles is not particularly limited, and examples of the material include metals such as Al, Au, Ti, Pt, Ag, Cu, Cr, Fe, Ni, and Si, metal oxides such as $SiO_2$, $Al_2O_3$, $TiO_2$, $MgO_2$, and $CaO_2$, organic polymers such as polystyrene and polymethyl methacrylate, other semiconductor materials, inorganic polymers, and the like. These may be used alone or in combination of two or more kinds.

The height and shape of convex portions in a concave-convex structure formed (the depth and shape of concave portions that are formed by transferring in the manufacturing method (B)) can be adjusted by selecting the material of the plural kinds of particles and dry etching conditions to be described later.

In a case of using water as the lower layer liquid, it is preferable that the plural kinds of particles have a hydrophobic surface. When the surface of the particles has hydrophobicity, as described above, when developing the dispersion liquid of the particles on the liquid surface of the lower layer liquid of the water tank (trough) to form the particle single layer film, the particle single layer film may be easily formed using water as the lower layer liquid, but also the particle single layer film can be easily migrated onto the surface of the substrate.

Among the particles exemplified above, particles of the organic polymer such as polystyrene have a hydrophobic surface, and thus the particles may be used as is. However, the metal particles or metal oxide particles can be used after making the surface thereof more hydrophobic using a hydrophobizing agent.

Examples of the hydrophobizing agent include a surfactant, alkoxysilane, and the like.

A method of using the surfactant as the hydrophobizing agent is effective for hydrophobization of various kinds of materials and is suitable for a case in which the particles are formed from metals, metal oxides, and the like.

As the surfactant, cationic surfactants such as hexadecyl trimethyl ammonium bromide and decyl trimethyl ammonium bromide, and anionic surfactants such as sodium dodecyl sulfate and sodium 4-octyl benzene sulfonate may be suitably used. In addition, alkane thiol, a disulphide compound, tetradecanoic acid, octadecanoic acid, and the like may be used.

A hydrophobization treatment using these surfactants may be carried out in a liquid after dispersing particles in a liquid such as an organic solvent and water, or may be carried out with respect to particles in a dried state.

In a case of carrying out the hydrophobization treatment in a liquid, for example, particles to be hydrophobized may be added to and dispersed in one or more kinds of volatile organic solvent selected from the group consisting of chloroform, methanol, ethanol, isopropanol, acetone, methyl ethyl ketone, ethyl ethyl ketone, toluene, n-hexane, cyclohexane, ethyl acetate, butyl acetate, and the like. Then, a surfactant may be mixed with the resultant dispersion liquid to further carry out dispersion. In this manner, when the particles are made to be dispersed in advance, and then the surfactant is added, the surface may be made to be hydrophobic in a relatively uniform manner. The dispersion liquid after the hydrophobization treatment may be used as is as a dispersion liquid to be added dropwise onto the liquid surface of the lower layer water.

In a case where the particles are to be hydrophobized in a water dispersion state, a method in which a surfactant is added to the water dispersion to carry out the hydrophobization treatment on a particle surface in an aqueous phase and an organic solvent is added to the water dispersion to carry out oil-phase extraction of the particles that are subjected to the hydrophobization treatment is also effective. The dispersion liquid (dispersion liquid in which the particles are dispersed in the organic solvent) obtained in this manner can be used as is as a dispersion liquid to be added dropwise onto the liquid surface of the lower layer water.

In addition, it is preferable to appropriately select a kind of the organic solvent and a kind of the surfactant and to combine the organic solvent and the surfactant so as to increase particle dispersibility of the dispersion liquid. When a dispersion liquid having high particle dispersibility is used, agglomeration of the particles in a cluster shape can be suppressed, and thus it is relatively easy to obtain the particle single layer film in which respective particles are two-dimensionally close-packed. For example, in a case where chloroform is selected as the organic solvent, it is preferable to use decyl trimethyl ammonium bromide as the surfactant. In addition to this, a combination of ethanol and sodium dodecyl sulfate, a combination of methanol and sodium 4-octyl benzene sulfonate, a combination of methyl ethyl ketone and octadecanoic acid, and the like may be exemplified as preferred examples.

With regard to a ratio between the particles to be hydrophobized and the surfactant, it is preferable that the mass of the surfactant be in a range of ⅓ times to ¹⁄₁₅ times the mass of the particles to be hydrophobized.

In addition, during the hydrophobization treatment, stirring of the dispersion liquid during treatment or irradiation of the dispersion liquid with ultrasonic waves is also effective from the viewpoint of improvement of the particle dispersibility.

A method in which alkoxysilane is used as a hydrophobizing agent is effective for hydrophobization of particles such as Si, Fe, and Al, oxide particles such as $SiO_2$, $Al_2O_3$, and $TiO_2$. However, there is no limitation to these particles, and basically, the method is applicable to any particle as long as the particle has a hydroxyl group on the surface.

Examples of alkoxysilane include monomethyltrimethoxysilane, monomethyltriethoxysilane, dimethyldiethoxysilane, phenyltriethoxysilane, hexyltrimethoxysilane, decyltrimethoxysilane, vinyltrichlorosilane, vinyltrimethoxysilane, vinyltriethoxysilane, 2-(3,4-epoxycyclohexyl)ethyltrimethoxysilane, 3-glycidoxypropyltrimethoxysilane, 3-glycidoxypropylmethyldiethoxysilane, 3-glycidoxypropyltriethoxysilane, p-styryltrimethoxysilane, 3-methacryloxypropylmethyldimethoxysilane, 3-methacryloxypropyltrimethoxysilane, 3-methacryloxypropylmethyldiethoxysilane, 3-methacryloxypropyltriethoxysilane, 3-acryloxypropyltrimethoxysilane, N-2(aminoethyl)3-aminopropylmethyldimethoxysilane, N-2(aminoethyl)3-aminopropyltrimethoxysilane, N-2(aminoethyl)3-aminopropyltriethoxysilane, 3-aminopropyltrimethoxysilane, 3-aminopropyltriethoxysilane, N-phenyl-3-aminopropyltrimethoxysilane, 3-ureidopropyltrimethoxysilane, 3-chloropropyltrimethoxysilane, 3-mercaptopropylmethyldimethoxysilane, 3-mercaptopropyltrimethoxysilane, 3-isocyanatepropyltriethoxysilane, and the like.

In a case where alkoxysilane is used as the hydrophobizing agent, hydrophobization is carried out in such a manner that an alkoxysilyl group in alkoxysilane is hydrolyzed to a silanol group, and the silanol group is dehydrated and concentrated to a hydroxyl group on a particle surface. Accordingly, the hydrophobization using alkoxysilane is preferably carried out in water.

In this manner, in a case of carrying out the hydrophobization in water, it is preferable to use a dispersant such as a surfactant in combination to stabilize a dispersion state of the particles before the hydrophobization. However, a hydrophobization effect of alkoxysilane may be reduced depending on a kind of the dispersant, and thus a combination of the dispersant and alkoxysilane is appropriately selected.

As a specific method of carrying out the hydrophobization with alkoxysilane, the following method may be exemplified. First, particles are dispersed in water, and the resultant dispersion liquid and an alkoxysilane-containing aqueous solution (aqueous solution containing a hydrolysate of alkoxysilane) are mixed with each other, and then reaction is allowed to occur for a predetermined time, preferably 6 hours to 12 hours, while appropriately carrying out stirring in a range from room temperature to 40° C. Due to the reaction under these conditions, the reaction appropriately proceeds, and thus a dispersion liquid of particles that are sufficiently hydrophobized is obtained. When the reaction proceeds excessively, silanol groups react with each other and particles are coupled to each other, and thus particle dispersibility of the dispersion liquid decreases. Accordingly, a particle single layer film obtained has a tendency to have two or more layers in which particles are partially agglomerated in a cluster shape. On the other hand, when the reaction is not sufficient, hydrophobization on the particle surface becomes insufficient. Accordingly, in the particle single layer film obtained, a pitch between particles has a tendency to be expanded.

In addition, alkoxysilane other than amine-based alkoxysilane is hydrolyzed under an acidic condition or an alkaline condition, and thus it is necessary to adjust pH of the dispersion liquid to acidity or alkalinity during reaction. A method of adjusting pH is not limited. However, the adjustment is carried out according to a method in which an acetic acid aqueous solution having a concentration of approximately 0.1% by mass to 2.0% by mass is added, in addition to promotion of hydrolysis, since an effect of stabilizing a silanol group may be obtained, and thus this method is preferable.

With regard to a ratio between the particles to be hydrophobized and alkoxysilane, it is preferable that the mass of alkoxysilane be in a range of ¹⁄₁₀ times to ¹⁄₁₀₀ times the mass of the particles to be hydrophobized.

After reaction for a predetermined time, one or more kinds of the above-described organic solvents are added to the resultant dispersion liquid to carry out oil-phase extraction of the particles that are hydrophobized in water. At this time, a volume of the organic solvents that are added is preferably in a range of 0.3 times to 3 times a volume of the dispersion liquid before addition of the organic solvents. The dispersion liquid (dispersion liquid in which the particles are dispersed in the organic solvents) obtained in this manner can be used as is as a dispersion liquid to be added dropwise onto the liquid surface of the lower layer water during the dropwise addition process. In addition, in the hydrophobization treatment, it is preferable to carry out stirring, ultrasonic irradiation, and the like to increase particle dispersibility of the dispersion liquid during treatment. When the particle dispersibility of the dispersion liquid is increased, agglomeration of the particles in a cluster shape can be suppressed, and thus it is easy to obtain the particle single layer film.

A-2 Process

In the A-2 process, the particle single layer film formed from the particle mixture obtained in the A-1 process is disposed at least on a part of the surface of the substrate.

Although not particularly limited, examples of the method of disposing the particle single layer film include a method of sequentially carrying out a process of forming a particle single layer film formed from the particle mixture on the liquid surface (a particle single layer film-forming process) by applying a liquid (lower layer liquid) that develops the particle mixture on a liquid surface thereof in a water tank, adding the dispersion liquid, in which the particle mixture is dispersed in the organic solvent, dropwise onto the liquid surface of the lower layer liquid, and vaporizing the organic solvent, and a process of moving the particle single layer film onto an original plate (transition process).

(Particle Single Layer Film-Forming Process)

In the particle single layer film-forming process, first, a water tank (trough) is prepared, and water (hereinafter, also referred to as lower layer water) as a lower layer liquid is put into the water tank (trough). Next, the dispersion liquid is added dropwise onto the liquid surface of the lower layer water. In this case, a plurality of particles in the dispersion liquid are developed on the liquid surface of the lower layer water due to the solvent that is a dispersion medium. Then, the solvent is vaporized, and thus a particle single layer film in which the plurality of particles are two-dimensionally arranged in a single layer is formed.

A concentration of the particles in the dispersion liquid is preferably set to 1% by mass to 10% by mass on the basis of the total mass of the dispersion liquid.

A speed of adding the dispersion liquid dropwise onto the liquid surface of the lower layer water is preferably set to 0.001 ml/second to 0.01 ml/second.

When the concentration of the particles in the dispersion liquid and the amount of dropwise addition are in these ranges, it is easy to obtain the particle single layer film in which a tendency of formation of two or more layers due to partial agglomeration of the particles in a cluster shape, occurrence of defective sites in which the particles are not present, and the like are suppressed.

The formation of the above-described particle single layer film is carried out by self-organization of the particles. The principle of the self-organization is as follows. When the particles gather, surface tension operates due to the dispersion medium that is present between the particles, and as a result, the particles are not present in a scattered state, and the particles automatically form a single layer structure in which the particles are close-packed on the water surface. In another expression, it also can be said that the formation of the close-packed structure due to the surface tension is mutual adsorption of the particles due to capillarity in a horizontal direction.

For example, three particles gather and come into contact with each other in a state in which the particles remain on the water surface, the surface tension operates in such a manner that a total length of a draft line of a particle group becomes the minimum, and thus the three particles are stabilized in an arrangement based on a triangle (particles having particle sizes different from each other do not form an equilateral triangle). In a case where the draft line is present on the apex of the particle group, that is, in a case where the particles enter the underside of the liquid surface, the self-organization does not occur, and the particle single layer film is not formed. Accordingly, with regard to the particles and the lower layer water, in a case where one side thereof has hydrophobicity, it is important that the other side is made to have hydrophilicity in order for the particle group not to enter into the underside of the liquid surface.

As the lower layer liquid, it is preferable to use water as described above. When using water, relatively large surface energy operates, and thus the single layer structure generated once, in which the particles are close-packed, has a tendency to stably last on the liquid surface.

Transition Process

In the transition process, the particle single layer film formed on the liquid surface of the lower layer water in the particle single layer film-forming process is moved in a single layer state onto an original plate to be etched.

A specific method of moving the particle single layer film onto the original plate is not particularly limited, and examples of the method include a moving method in which a hydrophobic original plate is made to descend from an upper side while being maintained to be approximately parallel with the particle single layer film, and is brought into contact with the particle single layer film, thereby transitioning the particle single layer film onto the original plate due to affinity between the hydrophobic particle single layer film and original plate, a method in which the original plate is disposed in advance in the lower layer water inside the water tank in an approximately horizontal direction before forming the particle single layer film, the particle single layer film is formed on the liquid surface, and then the liquid surface is made to gradually descend, thereby moving the particle single layer film onto the original plate, and the like. According to these methods, the particle single layer film can be moved onto the original plate without using a special device. However, it is preferable to employ a so-called LB method from the viewpoint that even in a particle single layer film having a relatively large area, it is easy to move the particle single layer onto the original plate while maintaining a close-packed state of the particles.

In the LB method, the original plate is immersed in advance in the lower layer water inside the water tank in an approximately vertical direction, and in this state, the above-described particle single layer film-forming process is carried out to form the particle single layer film. In addition, after the particle single layer film-forming process, the original plate is drawn upward, thereby moving the particle single layer film onto the original plate.

At this time, the particle single layer film is formed already on the liquid surface in a single layer state in the particle single layer film-forming process. Accordingly, even when a temperature condition (a temperature of the lower layer water) of the transition process, an original plate drawing-up speed, and the like vary little, there is no concern that the particle single layer film collapses and becomes a multi-layer, and the like.

Typically, the temperature of the lower layer water depends on an ambient temperature that varies according to the season or weather, and is approximately 10° C. to 30° C.

In addition, at this time, when using an LB trough apparatus provided with the surface pressure sensor according to a Wilhelmy method which measures the surface pressure of the particle single layer film and a movable barrier that compresses the particle single layer film in a direction along the liquid surface, it is possible to move the particle single layer film with a relatively large area onto the original plate in a relatively stable manner. According to this apparatus, it is possible to compress the particle single layer film at a preferable diffusion pressure (density) while measuring the surface pressure of the particle single layer film. In addition, it is possible to move the particle single layer at a constant speed toward the original plate. Accordingly, the transition of the particle single layer film from the liquid surface onto the original plate proceeds smoothly, and thus a problem such as difficulty in the transition of the particle single layer film with a small area onto the original plate is not likely to occur.

The diffusion pressure is preferably 5 $mNm^{-1}$ to 80 $mNm^{-1}$, and more preferably 10 $mNm^{-1}$ to 40 $mNm^{-1}$. With this diffusion pressure, it is easy to obtain a particle single layer film in which respective particles are close-packed without spacing. In addition, the original plate drawing-up speed is preferably 0.5 mm/minute to 20 mm/minute.

The surface of the original plate can be covered with the particle single layer film according to the transition process.

After the transition process, a fixing process of fixing the particle single layer film onto the original plate may be carried out as necessary. When the particle single layer film is fixed onto the original plate, movement of the particles on the original plate during the subsequent dry etching is suppressed, and thus it is possible to stably etch the surface of the original plate with high accuracy. Particularly, as the dry etching proceeds, a diameter of each of the particles gradually decreases, and thus a possibility of movement on the original plate increases.

As a method of the fixing process, a method of using a binder or a sintering method may be exemplified.

In the method of using the binder, a binder solution is supplied to the original plate, on which the particle single layer film is formed, on a particle single layer film side, and this binder solution is made to penetrate a space between the particle single layer film and the original plate.

A used amount of the binder is preferably 0.001 times to 0.02 times the mass of the particle single layer film. In this range, the particles may be sufficiently fixed without causing a problem of an adverse effect on etching accuracy due to an excessive binder between the particles. In a case where the binder solution is excessively supplied, after penetration of the binder solution, the surplus of the binder solution may be removed using a spin coater or by inclining the substrate.

As a kind of binder, alkoxysilane that is exemplified above as the hydrophobizing agent, a general organic binder or inorganic binder, and the like may be used. After the penetration of the binder solution, a heating treatment may be appropriately carried out according to the kind of binders. In a case of using alkoxysilane as the binder, the heating treatment is preferably carried out under conditions of 3 minutes to 60 minutes at a temperature of 40° C. to 80° C.

In a case of employing the sintering method, the respective particles that constitute the particle single layer film may be fused to the original plate by heating the original plate on which the particle single layer film is formed. Although the heating temperature may be determined depending on the material of the particles and the material of the original plate, since particles having a particle size of 1 µm or less initiate an interface reaction at a temperature lower than the intrinsic melting point of the material thereof, and thus the sintering is completed at a relatively low temperature side. When the heating temperature is too high, a fusion area of the particle increases, and as a result thereof, accuracy may be affected, for example, a shape of the particle single layer film may vary. In addition, when carrying out the heating in the air, the original plate or the respective particles may be oxidized, and thus it is preferable to carry out the heating under an inert gas atmosphere. In a case of carrying out the sintering under an oxygen-containing atmosphere, it is necessary to set conditions in consideration of an oxidized layer in the following etching process.

A-3 Process

In the A-3 process, the original plate is dry-etched using the particle single layer film as an etching mask to form a concave-convex structure in at least a part of the surface of the original plate. According to this, a target substrate may be obtained.

Specifically, when the dry etching is initiated, first, an etching gas passes through the spacing between the respective particles that constitute the particle single layer film, and reaches the surface of the original plate, and concave portions are formed at the portions. Therefore, convex portions are formed at positions corresponding to the respective particles. When the dry etching is continued, the particles on respective convex portions are gradually etched and become small. At the same time, the concave portions in the surface of the original plate become deep. In addition, ultimately, the respective particles are removed by the dry etching, and along with this, the concave-convex structure is formed in the original plate.

At this time, an average height and a shape of the convex portions that are formed may be adjusted by adjusting dry etching conditions (a bias, a gas flow rate, a kind of deposition gases or an amount of thereof, and the like).

Examples of the etching gas used for the dry etching include Ar, $SF_6$, $F_2$, $CF_4$, $C_4F_8$, $C_5F_8$, $C_2F_6$, $C_3F_6$, $C_4F_6$, $CHF_3$, $CH_2F_2$, $CH_3F$, $C_3F_8$, $Cl_2$, $CCl_4$, $SiCl_4$, $BCl_2$, $BCl_3$, $BC_2$, $Br_2$, $Br_3$, $HBr$, $CBrF_3$, $HCl$, $CH_4$, $NH_3$, $O_2$, $H_2$, $N_2$, $CO$, $CO_2$, and the like. However, there is no limitation thereto in a range not deteriorating the effect of the invention. One or more kinds of these may be used depending on the material of the particles that constitute the particle single layer film or the material of the original plate.

Examples of an etching apparatus that can be used include apparatuses such as a reactive ion etching apparatus and an ion beam etching apparatus which are capable of carrying out non-isotropic etching, and there is no particular limitation to specifications such as a plasma generation method, a structure of an electrode, a structure of a chamber, and a frequency of a high frequency power source as long as the apparatuses is capable of generating a bias electric field of approximately 20 W to the minimum.

In the A-3 process, it is preferable to set respective etching conditions (a material of the particles that constitute the particle single layer film, a material of the original plate, a kind of etching gases, a bias power, an antenna power, a gas flow rate, a gas pressure, an etching time, and the like) in such a manner that an etching selectivity (an etching rate of the original plate/an etching rate of the particle single layer film) during dry etching becomes 0.01 to 1.0.

For example, in a case where colloidal silica particles are selected as particles that constitute a particle single layer film etching mask, a quartz plate is selected as the original plate, and these are combined, when using a gas such as Ar or $CF_4$ as the etching gas, it is possible to carry out etching in such a manner that a ratio between the height of the convex portions and a distance between the convex portions becomes relatively small.

In addition, the bias of the electric field is set to several tens to several hundreds of W, electrostatic particles in the etching gas in a plasma state are accelerated, and are incident to the original plate at a high speed in a direction that is approximately perpendicular to the original plate. Accordingly, in a case of using a gas having reactivity with respect to the original plate, a reaction speed of physicochemical etching in the perpendicular direction can be increased.

Although depending on the combination of the material of the original plate and the kind of etching gases, isotropic etching due to a radical generated by plasma also occurs in combination during dry etching. The etching due to the radical is chemical etching, and an object to be etched is isotropically etched in all directions. The radical does not have a charge, and thus the etching rate may not be controlled by the setting of the bias power, and may be controlled by a concentration of the etching gas inside a chamber. To carry out the non-isotropic etching by charged particles, it is necessary to maintain a gas pressure to a certain degree, and thus it is difficult to make an effect by the radical zero as long as the reactive gas is used. However, a method of retarding the reaction speed of the radical by cooling down the original plate is widely used, and various apparatuses provided with the mechanism are present, and thus it is preferable to use these apparatuses.

In addition, in the dry etching process, mainly, the bias power is adjusted, and a so-called deposition gas is used in combination according to a situation, and thus a two-dimensional lattice structure in which a ratio between the diameter of the bottom surface of the convex portion and the height (diameter of the bottom surface of the convex portion/height) is relatively small can be formed in the surface of the original plate.

Manufacturing Method (B)

The manufacturing method (B) includes a process of obtaining a particle mixture in which a particle size distribution curve has a plurality of peaks (hereinafter, referred to as "B-1" process), a process of disposing a particle single layer film formed from the particle mixture on at least a part of the surface of a base material (hereinafter, referred to as "B-2" process), a process of forming a concave-convex structure in at least a part of the surface of the base material by dry-etching the base material by using the particle single layer film as an etching mask (hereinafter, referred to as "B-3" process), and a process of transferring the concave-convex structure or a concave-convex structure which is formed by transferring the concave-convex structure onto another base material onto at least a part of the surface of the substrate (hereinafter, referred to as "B-4" process).

The B-1 process may be carried out in the same manner as the A-1 process in the manufacturing method (A).

The B-2 process may be carried out in the same manner as the A-2 process in the manufacturing method (A) except that a base material is used instead of the substrate (original plate).

The base material used in the B-2 process is not particularly limited as long as the base material can be dry-etched.

In the case of the manufacturing method (A) of directly disposing the particle single layer film with respect to the original plate and drying-etched the original plate to manufacture the substrate, when manufacturing a transparent substrate, the original plate is limited to a transparent plate. However, in the manufacturing method (B), the base material on which the particle single layer film is disposed may not be transparent.

The B-3 process may be carried out in the same manner as the A-3 process in the manufacturing method (A).

In the B-4 process, the concave-convex structure of the base material (mold) on which the concave-convex structure obtained in the B-3 process is formed in at least a part of the surface is transferred onto at least a part of the surface of the original plate, or the concave-convex structure of the base material is transferred onto another base material to prepare an intermediate transfer body, and the concave-convex structure of the intermediate transfer body is transferred onto at least a part of the surface of the original plate. According to this, a target substrate may be obtained.

Transferring of the concave-convex structure in the mold onto the original plate or another base material can be carried out according to a method such as a nano imprint method, an injection method which are disclosed in Japanese Unexamined Patent Application, First Publication No. 2009-158478 which is incorporated herein by reference.

Another base material used to prepare the intermediate transfer body is not particularly limited as long as the intermediate transfer body can be dry-etched, similar to the base material used to prepare the mold.

The original plate or another base material onto which the concave-convex structure of the mold is transferred may have a single layer structure or a multi-layer structure. For example, the original plate or another base material may be obtained by laminating a transparent resin layer on the surface of a transparent glass plate. The material and layer configuration of the original plate or another base material may be appropriately set according to a transfer method and the like.

In a case of obtaining a target substrate by carrying out the transferring once, the concave-convex structure of the mold is directly transferred onto the original plate (substrate before the concave-convex structure is transferred) that corresponds to the target substrate.

In a case of obtaining the target substrate by carrying out the transferring two or more times, the concave-convex structure of the mold is transferred onto another base material, and is finally transferred onto an original plate corresponding to the target substrate. Another base material used may be the same as or different from the base material used in the mold or the original plate corresponding to the target substrate.

When transferring the concave-convex structure in the surface of the mold formed is carried out for an even number of times, a substrate having a concave-convex structure with the same shape as that of the concave-convex structure is obtained. In addition, the concave-convex structure in the surface of the mold formed is transferred onto another original plate for an odd number of times, a substrate having a concave-convex structure with a shape inverted from that of the concave-convex structure is obtained.

When the number of transfer times increases, a shape of a fine concavity and convexity becomes dull, and thus as a practical number of transfer times, one time to five times are preferable.

Organic Light-Emitting Diode

An organic light-emitting diode of the third aspect of the invention is an organic light-emitting diode prepared from an organic light-emitting diode substrate in which a concave-convex structure is provided in at least a part of the surface, wherein the concave-convex structure is a structure capable of obtaining an AFM image in which a plurality of dots are dispersed when observed by an AFM, when measuring a diameter (nm) of each of the plurality of dots present in a randomly selected region having an area of 25 $\mu m^2$ on the AFM image, obtaining a frequency distribution from the number of dots having a diameter corresponding to each of sections obtained by partitioning a diameter range for each 20 nm, calculating a total area of dots, which are present in each of the sections, from the frequency distribution, and creating a histogram in which the total area is shown in a Y-axis and the diameter of the dot is shown in an X-axis, the histogram has a plurality of peaks, the plurality of peaks include one main peak in which the total area of dots corresponding to a corresponding peak has a maximum value, and one or more sub-peaks in which the total area is 10% or more of the maximum value, and chromaticity of light emitted from the organic light-emitting diode is in a range of chromaticity coordinates $(x, y)=(0.28$ to $0.50, 0.29$ to $0.45)$ in a CIE standard colorimetric system.

In the organic light-emitting diode of this aspect, the plurality of peaks include a main peak and sub-peaks, and thus light of an arbitrary broadband wavelength region in the visible region can be efficiently extracted. In addition, the light emitted is satisfactory white light in which blueness or redness is reduced.

In a case where x and y in the CIE standard colorimetric system are close to a region of 0.25 or less, the blueness of the light emitted from the organic light-emitting diode becomes intensive, and in a case where x is close to a region of 0.5 or more, the redness of the light emitted from the organic light-emitting diode becomes intensive. Therefore, a color balance collapses and thus it is difficult to use the light as white light.

Accordingly, it is preferable that the chromaticity coordinates be in a range of (x, y)=(0.28 to 0.50, 0.29 to 0.45).

Hereinafter, embodiments of the organic light-emitting diode of this aspect will be shown and described.

First Embodiment

FIG. 1 shows a schematic cross-sectional diagram illustrating a configuration of an organic light-emitting diode 10 according to a first embodiment.

The organic light-emitting diode 10 of this embodiment is an organic light-emitting diode having a layer configuration in a type that is generally called a bottom emission type. The organic light-emitting diode 10 has a layer configuration in which a substrate 11, a positive electrode conductive layer 12, an EL layer 13, and a negative electrode conductive layer 14 are sequentially laminated.

The EL layer is a layer including a light-emitting layer that contains an organic light-emitting material. The EL layer 13 of this embodiment is constituted by a hole injection layer 13a, a hole transport layer 13b, light-emitting layers 13c, 13d, and 13e which are constituted by an organic light-emitting material, an electron transport layer 13f, and an electron injection layer 13g which are sequentially laminated from a positive electrode conductive layer 12 side. Each of these layers may have one function or two or more functions in combination. For example, the function of the electron transport layer and the function of the light-emitting layer may be achieved by one layer.

A voltage may be applied to the positive electrode conductive layer 12 and the negative electrode conductive layer 14.

When a voltage is applied to the positive electrode conductive layer 12 and the negative electrode conductive layer 14, holes and electrons are injected to the EL layer 13 from the positive electrode conductive layer 12 and the negative electrode conductive layer 14, respectively. The holes and electrons that are injected are coupled with each other in the light-emitting layer 13c, and thus excitors are generated. When the excitors are recoupled, light is generated. The light generated is extracted from the surface of the organic light-emitting diode 10 on a substrate 11 side.

For extraction of the light, a transparent substrate is used as the substrate 11, and a transparent conductor is used as the positive electrode conductive layer 12.

A concave-convex structure is provided to the surface of the substrate 11 on a side at which the positive electrode conductive layer 12 is laminated. The concave-convex structure will be described later in detail.

The positive electrode conductive layer 12, the EL layer 13 (the hole injection layer 13a, the hole transport layer 13b, the light-emitting layers 13c, 13d, and 13e, and the electron transport layer 13f), and the negative electrode conductive layer 14 are sequentially formed on the surface of the substrate 11 on a side at which the concave-convex structure is provided. Accordingly, the respective layers have a shape that reflects the shape of a lamentation surface (surface in which the concave-convex structure is provided) of the substrate 11. Specifically, the shape of the respective layers, which are formed, on a side opposite to a substrate 11 side has the same shape as the lamination surface of the substrate 11. On the other hand, a shape of the surface on the substrate 11 side is inverted from the shape of the lamination surface of the substrate 11.

Substrate 11

The substrate 11 is a substrate of the first aspect of the invention.

The concave-convex structure that is provided on the surface of the substrate 11 of this embodiment on a side at which the positive electrode conductive layer 12 is laminated is a concave-convex structure (hereinafter, also referred to as a truncated conical concave-convex structure) in which a plurality of convex portions 15a, 15b, and 15c which have a truncated conical shape and have diameters different from each other are two-dimensionally and randomly arranged.

"Two-dimensional and random arrangement" of the plurality of convex portions 15a, 15b, and 15c represents a state in which these convex portions are arranged on the same plane, and a spacing between the centers of these convex portions and an arrangement direction thereof is not constant.

When the positive electrode conductive layer 12 and the EL layer 13 (the hole injection layer 13a, the hole transport layer 13b, the light-emitting layers 13c, 13d, and 13e, the electron transport layer 130 are sequentially laminated on the truncated conical concave-convex structure, the respective layers, which are formed, have the same truncated conical concave-convex structure as the truncated conical concave-convex structure of the substrate 11 in the surface on a side opposite to the substrate 11 side. Accordingly, when the negative electrode conductive layer 14 is ultimately laminated on the EL layer 13, a two-dimensional concave-convex structure having a shape inverted from the truncated conical concave-convex structure in the surface of the substrate 11, that is, a concave-convex structure (hereinafter, also referred to as an inverted truncated conical concave-convex structure), in which a plurality of concave portions 16a, 16b, and 16c which have an inverted truncated conical shape and have diameters different from each other are two-dimensionally and randomly arranged, is formed in the surface of the negative electrode conductive layer 14 on an EL layer 13 side.

The diameter and depth of each of the concave portions 16a, 16b, and 16c in the inverted truncated conical concave-convex structure equal to the diameter and height of each of the convex portions 15a, 15b, and 15c in the truncated conical concave-convex structure. In addition, an arrangement pattern of the concave portions 16a, 16b, and 16c in the inverted truncated conical concave-convex structure equals the arrangement pattern of the convex portions 15a, 15b, and 15c in the truncated conical concave-convex structure.

When observing the truncated conical concave-convex structure with the atomic force microscope (AFM), each of the convex portions 15a, 15b, and 15c having the truncated conical shape is detected as a dot having a corresponding diameter. That is, when observing the truncated conical concave-convex structure by the AFM, an AFM image, in which a plurality of dots having a different diameter which correspond to the plurality of convex portions 15a, 15b, and 15c are dispersed, is obtained.

Accordingly, when measuring a diameter (nm) of each of the plurality of dots present in a randomly selected region having an area of 25 $\mu m^2$ on the AFM image of the truncated conical concave-convex structure, obtaining a frequency distribution from the number of dots having a diameter corresponding to each of sections obtained by partitioning a diameter range for each 20 nm, calculating a total area of dots, which are present in each of the sections, from the frequency distribution, and creating a histogram in which the total area is shown in a Y-axis and the diameter of the dot is shown in an X-axis, the histogram has a plurality of peaks.

In addition, in this embodiment, the plurality of peaks include one main peak in which the total area of dots corresponding to a corresponding peak has a maximum value, and one or more sub-peaks in which the total area is 10% or more of the maximum value. According to this, the organic light-emitting diode 10 can efficiently extract light of a broadband, and chromaticity of light emitted from the organic light-emitting diode 10 is in a range of chromaticity coordinates (x, y)=(0.28 to 0.50, 0.29 to 0.45) in a CIE standard colorimetric system.

In addition, the light emitted is satisfactory white light in which blueness or redness is reduced.

In a case where x and y in the CIE standard colorimetric system are close to a region of 0.25 or less, the blueness of the light emitted from the organic light-emitting diode becomes intensive, and in a case where x is close to a region of 0.5 or more, the redness of the light emitted from the organic light-emitting diode becomes intensive. Therefore, a color balance collapses and thus it is difficult to use the light as white light.

Accordingly, it is preferable that the chromaticity coordinates be in a range of (x, y)=(0.28 to 0.50, 0.29 to 0.45).

The substrate 11 in this embodiment is a transparent substrate.

A material that constitutes the transparent substrate is not particularly limited as long as the material is capable of transmitting light of a target extraction wavelength, and the material may be an inorganic material, an organic material, or a combination of these. Examples of the inorganic material include various kinds of glass such as quartz glass, alkali-free glass, white sheet glass, transparent inorganic mineral such as mica, and the like. Examples of the organic material include a resin film such as a cycloolefin-based film and a polyester-based film, a fiber reinforced plastic material obtained by mixing a microfiber such as a cellulose nanofiber in the resin film, and the like.

Although also depending on a use, as the transparent substrate, a substrate having a high visible-light transmittance is generally used. With regard to the visible-light transmittance, 70% or more is preferable from the viewpoint of not giving deflection to a spectrum in a visible light region (wavelength of 380 nm to 780 nm), more preferably 80% or more, and still more preferably 90% or more.

Positive Electrode Conductive Layer 12

A transparent conductor through which light having a target extraction wavelength transmits is used for the positive electrode conductive layer 12.

As the transparent conductor, a material that is known as a transparent conductive layer may be used without particular limitation. For example, examples of the material include indium-tin oxide (ITO), indium-zinc oxide (IZO), zinc oxide (ZnO), zinc tin oxide (ZTO), and the like.

The thickness of the positive electrode conductive layer 12 is typically 50 nm to 500 nm.

In addition, the thickness of each of the layers that constitute the organic light-emitting diode 10 can be measured by a spectroscopic ellipsometer, a contact-type step gauge, an AFM, and the like.

EL Layer 13

An EL (electroluminescence) layer includes at least a light-emitting layer that contains an organic light-emitting material. The EL layer may be constituted by the light-emitting layer alone, but the EL layer generally further includes another layer other than the light-emitting layer. Another layer may be constituted by an organic material or an inorganic material as long as the function of the light-emitting layer is not deteriorated.

In this embodiment, the EL layer 13 is constituted by seven layers including the hole injection layer 13a, the hole transport layer 13b, the light-emitting layers 13c, 13d, and 13e, the electron transport layer 13f, and the electron injection layer 13g. Among these layers, the most important layer is the light-emitting layer, and for example, the hole injection layer or the electron injection layer may be omitted depending on a layer configuration. In addition, the electron transport layer may also serve as the light-emitting layer. As materials that constitute these layers, materials that are known may be used without particular limitation.

Among these materials, as an organic light-emitting material that constitutes the light-emitting layer 13c, 13d, and 13e, a material that is known until now as an organic light-emitting material that constitutes the light-emitting layer of the organic EL may be used, and examples thereof include an organic compound that generates fluorescence and/or phosphorescence, a compound obtained by doping another material (host material) with the organic compound, a compound obtained by doping the organic compound with a doping material, and the like.

As the organic compound that generates fluorescence and/or phosphorescence, a pigment-based organic compound, a metal complex-based organic compound, a polymer-based organic compound, and the like are known, and any one of these may be used. Specific examples of the pigment-based organic compound include 1,4-bis[4-(N,N-diphenylaminostyrylbenzene)](hereinafter, abbreviated as DPAVB), 2,3,6,7-tetrahydro-1,1,7,7-tetramethyl-1H,5H,11H-10-(2-benzothiazolyl)quinolizine[9,9a,1-gh] (hereinafter, abbreviated as coumarin C545T), 4,4'-bis(2,2-diphenyl-ethen-1-yl)biphenyl (hereinafter, abbreviated as DPVBi) that is a distyrenearylene derivative, and the like. In addition, specific examples of the metal complex-based organic compound include Tris(8-quinolinolato)aluminum (hereinafter, abbreviated as Alq), Tris[1-phenylisoquinoline-C2,N]iridium (III) (hereinafter abbreviated as Ir(piq)$_3$), Bis[2-(2-benzoxazolyl)phenolato]Zinc (II) (hereinafter, abbreviated as ZnPBO), and the like.

As the host material, for example, the following hole transport material, electron transport material, and the like may be used.

The doping material is used to improve light-emitting efficiency and to vary a wavelength of light generated, and examples of the doping material include 4,4'-bis(9-ethyl-3-carbazovinylene)-1,1'-biphenyl (hereinafter, abbreviated as BcZVBi) that is distyrenearylene derivative, and the like.

In this embodiment, the light-emitting layer has a multilayer structure in which a plurality of light-emitting layers 13c, 13d, and 13e containing a different organic light-emitting material are directly laminated on each other.

A combination of organic light-emitting materials that are contained in the respective light-emitting layers 13c, 13d, and 13e is set according to an extraction spectrum, which is required, from the organic light-emitting diode 10.

Typically, one kind of organic light-emitting material has one light-emitting peak. Therefore, in the invention, it is necessary for the light-emitting layers 13c, 13d, and 13e to contain organic light-emitting materials having light-emitting peaks different from each other, respectively, so as to extract light of an arbitrary broadband wavelength region in a visible region (380 nm to 780 nm). For example, when combining a red light-emitting material in which a light-emitting peak is in a range of 620 nm to 750 nm, a green light-emitting material in which a light-emitting peak is in a range of 495 nm to 570 nm, and a blue light-emitting material in which a light-emitting peak is in a range of 450 nm to 495 nm, light beams that are generated are composed, and thus white light is extracted from the substrate 11 side of the organic light-emitting diode 10. In addition, in a combination of the blue light-emitting material and a yellow light-emitting material in which a light-emitting peak is in a range of 570 nm to 590 nm, white light may be composed.

In addition, here, an example of a so-called multi-layer type, in which the plurality of layers containing organic light-emitting materials different from each other, respectively, are laminated to constitute a light-emitting layer, is illustrated, but the invention is not limited thereto. For example, the light-emitting layer may be a single layer that contains plural kinds of organic light-emitting materials as a mixture. In addition, a multi-layer structure of a lamination type other than the multi-layer type may be employed. Examples of the lamination type other than the multi-layer type include a tandem type, and the like.

The multi-layer type and the tandem type are known as a structure of a light-emitting layer in a white light-emitting diode for an illuminating device. For example, the multi-layer type is a type in which a plurality of monochromatic light-emitting layers (for example, a red light-emitting layer, a green light-emitting layer, and a blue light-emitting layer) are directly laminated. The tandem type is a type in which a plurality of monochromatic light-emitting layers are laminated through an intermediate layer. The intermediate layer is constituted by a material having charge generating ability (for example, Japanese Unexamined Patent Application, First Publication Nos. 2010-129301 and 2010-192366, Published Japanese Translation No. 2010-527108 of the PCT International Publication, and the like).

Generally, in the multi-layer type, the shorter a wavelength of light generated is, the further on a negative electrode conductive layer 14 side, the plurality of monochromatic light-emitting layers are disposed. For example, the plurality of monochromatic light-emitting layers are constituted by three layers including the red light-emitting layer, the green light-emitting layer, and the blue light-emitting layer, the blue light-emitting layer is disposed at a position that is closest to the negative electrode conductive layer 14, and the red light-emitting layer is disposed at a position that is the farthest from the negative electrode conductive layer 14. However, the lamination order of the light-emitting layers of the respective colors may be changed in consideration of a charge balance.

In addition, in a case where a color conversion layer that converts a wavelength of light is further provided between the positive electrode conductive layer 12 and the substrate 11, only one kind of organic light-emitting material may be contained in the light-emitting layers 13c, 13d, and 13e. In addition, the light-emitting layers 13c, 13d, and 13e may be constituted by one layer.

As the color conversion layer, typically, a color conversion layer, which converts incident light to light of a wavelength longer than that of the incident light (for example, a color conversion layer that converts blue light to green light, and a color conversion layer that converts green light to red light), is used.

For example, when one layer of the light-emitting layers 13c, 13d, and 13e is set as a blue light-emitting layer, and a color conversion layer that converts blue light to green light and a color conversion layer that converts green light to red light are sequentially laminated on a substrate 11 side of the positive electrode conductive layer 12, white light is extracted from the substrate 11 side of the organic light-emitting diode 10.

As materials that constitute the hole injection layer 13a, the hole transport layer 13b, and the electron transport layer 13f, generally, organic materials are used, respectively.

Examples of the material (hole injection material) that constitutes the hole injection layer 13a include 4,4',4"-tris(N, N-2-naphthylphenylamino)triphenylamine (hereinafter, abbreviated as 2-TNATA), and the like.

Examples of the material (hole transport material) that constitutes the hole transport layer 13b include aromatic amine compounds such as 4,4'-bis[N-1-napthyl]-N-phenylamino]-biphenyl (hereinafter, abbreviated as α-NPD), Copper phthalocyanine (hereinafter, abbreviated as CuPc), and N,N'-Diphenyl-N,N'-di(m-tolyl)benzidine (hereinafter, abbreviated as TPD).

Examples of the material (electron transport material) that constitutes the electron transport layer 13f include metal complex-based compounds such as the Alq, and oxadiol-based compounds including 2,5-Bis(1-naphthyl)-1,3,4-oxadiazole (hereinafter, abbreviated as BND), 2-(4-tert-Butylphenyl)-5-(4-biphenylyl)-1,3,4-oxadiazole (hereinafter, abbreviated as PBD), and the like.

The electron injection layer 13g is not an essential component, but when the electron injection layer 13g is provided between the electron transport layer 13f and the negative electrode conductive layer 14, a difference in a work function is reduced, and thus transition of electrons from the negative electrode conductive layer 14 to the electron transport layer 13f becomes easy.

However, when using a magnesium alloy such as Mg/Ag=10/90 to 90/10 as the negative electrode conductive layer 14, even when the electron injection layer 13g is not provided, an electron injection effect may be obtained.

As a material that constitutes the electron injection layer 13g, lithium fluoride (LiF) and the like may be used.

The total thickness of the EL layer 13 is typically 30 nm to 500 nm.

Negative Electrode Conductive Layer 14

The negative electrode conductive layer 14 is formed from a metal.

Examples of the metal include Ag, Au, Al, and an alloy containing any one of these metals as a main component. Here, "containing the metal as a main component" represents that an occupation ratio of Ag, Au, or Al in the alloy is 70% by mass or more.

As a metal other than the main component, which constitutes the alloy, Mg and the like may be exemplified.

Specific examples of the alloy include magnesium alloy such as Mg/Ag=10/90 to 90/10 (mass ratio).

The thickness of the negative electrode conductive layer 14 is typically 50 nm to 3000 nm.

Method of Manufacturing Organic Light-Emitting Diode 10

For example, in a case of a lamination type, the organic light-emitting diode 10 may be manufactured in the following sequence.

A substrate 11 provided with a concave-convex structure in which a plurality of convex portions 15a, 15b, and 15c having diameters different from each other are two-dimensionally and randomly arranged in the surface is prepared (substrate manufacturing process). Next, the positive electrode conductive layer 12, the EL layer 13 (the hole injection layer 13a, the hole transport layer 13b, the light-emitting layer 13c (red), the light-emitting layer 13d (green), the light-emitting layer 13e (blue), the electron transport layer 13f, and the electron injection layer 13g), and the negative electrode conductive layer 14 are sequentially laminated on the concave-convex structure of the substrate 11 (lamination process).

According to these processes, the organic light-emitting diode 10 may be obtained.

Substrate Manufacturing Process

The substrate manufacturing process may be carried out by the above-described substrate manufacturing method (A) or (B).

For example, in the A-1 process of the above-described manufacturing method (A), as plural kinds of particles having average particle sizes different from each other, three kinds of particles and which correspond to the respective convex portions 15a, 15b, and 15c are mixed with each other to prepare the above-described particle mixture, whereby the substrate 11 may be obtained.

In addition, in the B-1 process of the above-described manufacturing method (B), as plural kinds of particles having average particle sizes different from each other, three kinds of particles which correspond to the convex portions 15a, 15b, and 15c are mixed with each other to prepare the above-described particle mixture, and the transferring in the B-4 process is carried out for an even number of times, the whereby the substrate 11 may be obtained.

Figure 2:
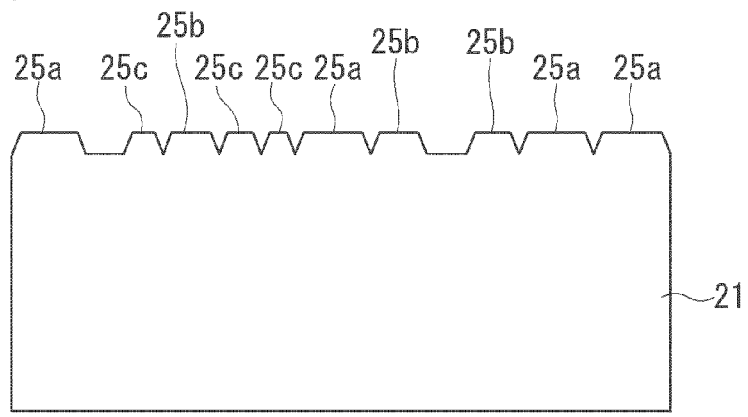
FIG. 2 is a schematic cross-sectional diagram illustrating an example of a base material (mold 21) in which a concave-convex structure is formed in at least a part of the surface.

For example, as a mold, a mold having the same shape as the substrate 11, that is, as shown in FIG. 2, a mold 21 which is provided with a concave-convex structure, in which a plurality of convex portions 25a, 25b, and 25c having diameters different from each other are two-dimensionally and randomly arranged, in the surface is prepared. When transferring the concave-convex structure of the surface of the mold 21 for an even number of times, similar to the mold 21, a substrate having a concave-convex structure, in which the plurality of convex portions 25a, 25b, and 25c having diameters different from each other are two-dimensionally and randomly arranged, in the surface may be obtained.

Lamination Process

In the lamination process, the positive electrode conductive layer 12, the EL layer 13 (the hole injection layer 13a, the hole transport layer 13b, the light-emitting layer 13c, the light-emitting layer 13d, the light-emitting layer 13e, the electron transport layer 13f, and the electron injection layer 13g), and the negative electrode conductive layer 14 are laminated in this order on the concave-convex structure of the substrate 11 prepared in the substrate manufacturing process.

The light-emitting layers 13c, 13d, and 13e are monochromatic light-emitting layers which contain organic light-emitting materials different from each other. In this embodiment, the light-emitting layer 13c is a red light-emitting layer, the light-emitting layer 13d is a green light-emitting layer, and the light-emitting layer 13e is a blue light-emitting layer.

In this manner, in a case of constituting the light-emitting layer in a multi-layer structure in which a plurality of the monochromatic light-emitting layers containing organic light-emitting materials different from each other are laminated, among the plurality of the monochromatic light-emitting layers, a light-emitting layer in which a wavelength of generated light is short is preferably formed on a further negative electrode conductive layer 14 side.

However, the invention is not limited thereto. For example, the lamination order of the red light-emitting layer, the green light-emitting layer, and the blue light-emitting layer is not limited the above-described order, and these layers may be laminated in an order according to characteristics of the respective light-emitting layers. In addition, the light-emitting layer may have a two-layer structure in combination of the blue light-emitting layer and the yellow light-emitting layer.

The light-emitting layer may be a single layer containing a mixture of a plurality of organic light-emitting materials.

In a case where the light-emitting layer has a multi-layer structure, the lamination type is not limited to the multi-layer type in which the respective layers are directly laminated as described above, and the other lamination types may be employed. For example, a tandem type in which an intermediate layer is laminated before laminating next monochromatic light-emitting layer on one monochromatic light-emitting layer may be employed.

These method of laminating the respective layers is not particularly limited, and a known method that has been used in a field of manufacturing a general organic light-emitting diode may be used. For example, the positive electrode conductive layer 12 and the negative electrode conductive layer 14 may be formed by a sputtering method, a vacuum deposition method, and the like, respectively. In addition, the respective layers of the EL layer 13 are formed according to the vacuum deposition method.

Since the thickness of the positive electrode conductive layer 12 and the EL layer 13 is too small, when sequentially laminating the respective layers as described above, the concave-convex structure in the surface of the substrate 11 is duplicated onto the respective layers. Accordingly, the negative electrode conductive layer 14 laminated on the EL layer 13 has an inverted truncated conical concave-convex structure with a shape inverted from the truncated conical concave-convex structure in the surface on an EL layer 13 side.

Second Embodiment

Figure 3:
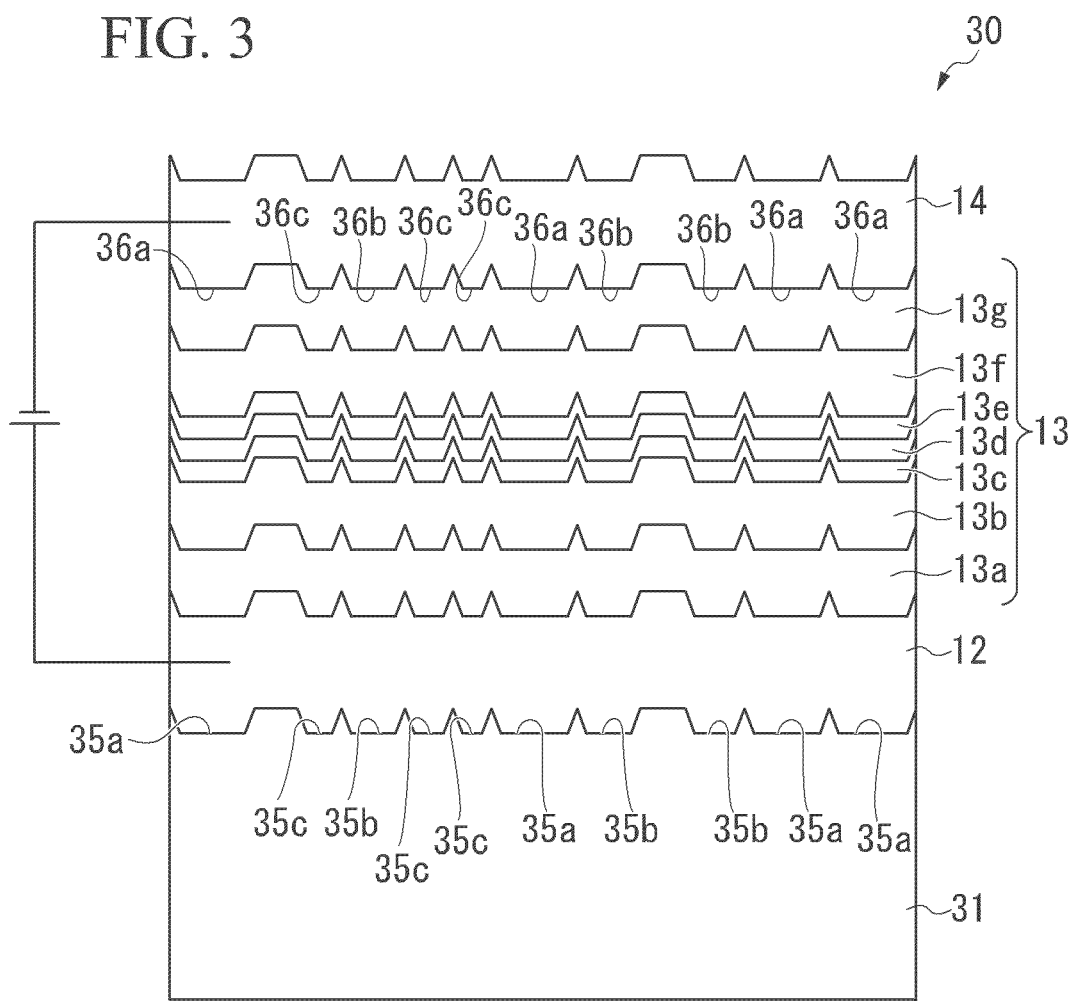
FIG. 3 is a schematic cross-sectional diagram illustrating a configuration of an organic light-emitting diode 30 according to a second embodiment of the invention.

FIG. 3 shows a schematic cross-sectional diagram illustrating a configuration of an organic light-emitting diode 30 according to a second embodiment.

The organic light-emitting diode 30 according to this embodiment has the same configuration as the organic light-emitting diode 10 of the first embodiment except that a substrate 31 having a concave-convex structure with a shape inverted from the concave-convex structure of the substrate 11 in the surface is used instead of the substrate 11, and according to this, the shape of the concave-convex structure of the other layers (the positive electrode conductive layer 12, the EL layer 13 (the hole injection layer 13a, the hole transport layer 13b, the light-emitting layers 13c, 13d, and 13e, the electron transport layer 130, and the negative electrode conductive layer 14) that are laminated on the substrate 31 is also inverted from the concave-convex structure in the first embodiment.

The substrate 31 has a concave-convex structure (inverted truncated conical concave-convex structure) in which a plurality of inverted truncated conical concave portions 35a, 35b, and 35c having diameters different from each other are two-dimensionally and randomly arranged in the surface.

The substrate 31 may be embedded by the above-described substrate manufacturing method (B). For example, in the B-1 process of the above-described manufacturing method (B), as plural kinds of particles having average particle sizes different from each other, three kinds of particles which correspond to the concave portions 35a, 35b, and 35c are mixed with each other to prepare the above-described particle mixture, and the transferring in the B-4 process is carried out for an odd number of times, whereby the substrate 11 may be obtained.

For example, as a mold, a mold having the same shape as the substrate 11, that is, as shown in FIG. 2, a mold 21 which is provided with a concave-convex structure, in which a plurality of convex portions 25a, 25b, and 25c having diameters different from each other are two-dimensionally and randomly arranged, in the surface is prepared. When transferring the concave-convex structure of the surface of the mold 21 for an odd number of times, the substrate 31 having a concave-convex structure in which the plurality of concave portions 35a, 35b, and 35c having diameters different from each other are two-dimensionally and randomly arranged in the surface may be obtained. The shape of the concave portions 35a, 35b, and 35c is a shape inverted from the shape of the convex portions 25a, 25b, and 25c.

Similar to the first embodiment, when laminating the positive electrode conductive layer 12, the EL layer 13 (the hole injection layer 13a, the hole transport layer 13b, the light-emitting layer 13c, the light-emitting layer 13d, the light-emitting layer 13e, the electron transport layer 13f, and the electron injection layer 13g), and the negative electrode conductive layer 14 in this order on the concave-convex structure of the substrate 31, the organic light-emitting diode 30 may be obtained.

In the organic light-emitting diode 30, a concave-convex structure having a shape inverted from the concave-convex structure in the surface of the substrate 31, that is, a concave-convex structure, in which a plurality of convex portions 36a, 36b, and 36c having diameters different from each other are two-dimensionally and randomly arranged, is formed in the surface of the negative electrode conductive layer 14 on an EL layer 13 side.

The diameter and height of each of the convex portions 36a, 36b, and 36c equal to the diameter and height (depth) of each of the concave portions 35a, 35b, and 35c. In addition, an arrangement pattern of the convex portions 36a, 36b, and 36c equals an arrangement pattern of the concave portions 35a, 35b, and 35c in the concave-convex structure in the surface of the substrate 31.

Hereinbefore, the first and second embodiments of the organic light-emitting diode of this aspect have been described, but the invention is not limited thereto.

For example, in the first and second embodiments, description has been made with respect to an example in which the organic light-emitting diode substrate is the substrate (substrate 11 or 31) of the first aspect of the invention, but the effect of the invention may be obtained as long as chromaticity of light emitted is in a range of chromaticity coordinates (x, y)=(0.28 to 0.50, 0.29 to 0.45) in a CIE standard colorimetric system.

In the first embodiment, description has been made with respect to a case in which the shape of the convex portions 15a, 15b, and 15c is a truncated conical shape, but the invention is not limited thereto. For example, the shape may be a columnar shape, a conical shape, a sinusoidal wave shape, a derivation shape on the basis of these shapes, and the like. In the second embodiment, description has been made with respect to a case in which the shape of the concave portions 35a, 35b, and 35c is an inverted truncated conical shape, but the invention is not limited thereto. For example, the shape may be a columnar shape, an inverted conical shape, an inverted sinusoidal wave shape, or a derivation shape on the basis of these shapes, and the like.

In the first and second embodiments, description has been made with respect to an example in which the EL layer 13 is constituted by seven layers including the hole injection layer 13a, the hole transport layer 13b, the light-emitting layers 13c, 13d, and 13e, the electron transport layer 13f, and the electron injection layer 13g, but the invention is not limited thereto. For example, one layer may have the functions of two or more layers among the hole injection layer 13a, the hole transport layer 13b, the light-emitting layers 13c, 13d, and 13e, the electron transport layer 13f, and the electron injection layer 13g. In addition, layers other than the light-emitting layers 13c, 13d, and 13e, for example, the hole injection layer 13a or the hole transport layer 13b, the electron transport layer 13f, and the electron injection layer 13g may be omitted. The simplest system is a system in which the EL layer 13 is constituted by the light-emitting layers 13c, 13d, and 13e alone.

In addition, description has been made with respect to an example in which the electron injection layer 13g is provided, but in a case where the negative electrode conductive layer 14 also has a function of an electron injection layer, the electron injection layer 13g may not be provided. For example, when the negative electrode conductive layer 14 is constituted by a magnesium alloy such as Mg/Ag=10/90, as described above, the electron injection effect may be obtained, and the negative electrode conductive layer 14 has a function of the electron injection layer.

In addition, as described above, a layer configuration of the light-emitting layer may be a multi-layer type or a tandem type.

In the first and second embodiment, description has been made with respect to an example in which the positive electrode conductive layer 12, the EL layer 13, and the negative electrode conductive layer 14 are laminated in this order on the substrate 11 or 31, but the lamination may be carried out in a reverse order. That is, the negative electrode conductive layer 14, the EL layer 13, and the positive electrode conductive layer 12 may be laminated in this order on the substrate 11 or 31. In this case, the lamination order of the hole injection layer 13a, the hole transport layer 13b, the light-emitting layers 13c, 13d, and 13e, the electron transport layer 13f, and the electron injection layer 13g that constitute the EL layer 13 is also reversed.

In addition, description has been made with respect to an example in which the negative electrode conductive layer is constituted by only the negative electrode conductive layer 14 that is a metal layer, but the negative electrode conductive layer may have a multi-layer structure in which a plurality of layers are laminated.

In a case where the negative electrode conductive layer has a multi-layer structure, at least one layer may be a metal layer, and other layers may be formed from a metal or a conductive material other than the metal. Examples of the conductive material other than the metal include ITO, IZO, ZnO, ZTO, and the like which are exemplified as a material that constitutes the positive electrode conductive layer 12.

A light extraction type of the organic light-emitting diode may be a bottom emission type in which a light extraction plane is the surface on a substrate (substrate 11 or 31) side as described in the first and second embodiments, or may be a top emission type in which the light extraction surface is the surface (lamination top surface) that is opposite to the substrate side.

In a case of the top emission type, the lamination top surface may be the negative electrode conductive layer or the positive electrode conductive layer. However, in any case, it is also necessary for these layers to be transparent or translucent in order for light radiated from an EL layer side to transmit therethrough. In addition, in a case of the top emission type, the substrate is not limited to a transparent substrate.

A general lamination configuration of the various kinds of light extraction types will be described below.

1) Bottom Emission Type [Light Extraction Plane is Transparent Substrate]:

Transparent substrate (having a concave-convex structure in the surface on a positive electrode conductive layer side)–positive electrode conductive layer (transparent conductor layer)–EL layer {hole injection layer–hole transport layer–light-emitting layer (three layers of red, green, and blue, or blue+yellow or green+red)–electron transport layer–electron injection layer}–negative electrode conductive layer (metal layer).

2) Top Emission Type [Light Extraction Plane is Negative Electrode Conductive Layer]:

Substrate (having a concave-convex structure in the surface on a reflective layer side)–reflective layer–positive electrode conductive layer (transparent conductor layer)–EL layer {hole injection layer–hole transport layer–light-emitting layer (three layers of red, green, and blue, or blue+yellow or green+red)–electron transport layer–electron injection layer}–negative electrode conductive layer A (translucent metal layer)–negative electrode conductive layer B (transparent conductor layer).

3) Top Emission Type [Light Extraction Plane is Positive Electrode Conductive Layer]:

Substrate (having a concave-convex structure in the surface on a negative electrode conductive layer side)–negative electrode conductive layer (metal layer)–EL layer {electron injection layer–electron transport layer–light-emitting layer (three layers of red, green, and blue, or blue+yellow or green+red)–hole transport layer–hole injection layer}–positive electrode conductive layer (transparent conductor layer).

Among the above-described types, in the top emission type (2), the reflective layer is provided in order for light not to be emitted from a substrate side and in order for light facing the substrate side to be reflected toward a lamination side and to be extracted. Generally, the reflective layer is constituted by a metal. As the metal, aluminum, silver, and various kinds of other metals may be used.

The negative electrode conductive layer A is set to be translucent in order to extract light from the lamination top surface. The transparency of the negative electrode conductive layer A is adjusted by a film thickness. The thickness of the negative electrode conductive layer A is typically set to approximately 10 nm to 50 nm in order to be translucent. As the metal that constitutes the negative electrode conductive layer A, the same metal as that exemplified as a metal that constitutes the negative electrode conductive layer 14 may be used, and a metal selected from the group consisting of gold, silver, and aluminum is preferably used. Magnesium may be mixed-in in a concentration of 10% or less in order to have a function of the electron injection layer.

The negative electrode conductive layer B is provided because when the negative electrode conductive layer A is provided alone, the thickness is too small, and thus a sufficient current is not obtained. Examples of the transparent conductor that constitutes the negative electrode conductive layer B include ITO, IZO, ZnO, ZTO, and the like that are exemplified as a material that constitutes the positive electrode conductive layer 12.

In the above-described organic light-emitting diode of the invention, the extraction efficiency of light of broadband is dramatically improved, and thus high-intensity light emission may be obtained.

Accordingly, the organic light-emitting diode of the invention is useful for manufacturing of an organic light-emitting diode in which the light extraction wavelength ranges over the entirety of a visible region (380 nm to 780 nm). More specifically, a wavelength region that is necessary in the visible region is set, and the light extraction efficiency over the entirety of the wavelength region can be dramatically increased.

In addition, when the organic light-emitting diode of the invention is used, a bright image display device or a bright illuminating device may be obtained.

EXAMPLES

An example of the embodiments of the invention will be described below. It is not necessary to limit a structure, a configuration, and a type of the organic light-emitting diode that is a target as long as the concept of the invention is used.

Example 1

5.0% by mass water dispersion (dispersion liquid) of spherical colloidal silica in which an average particle size $\Lambda 1$ was 250.6 nm and a variation coefficient of the particle size was 3.0%, and 5.0% by mass water dispersion (dispersion liquid) of spherical colloidal silica in which an average particle size $\Lambda 2$ was 150.1 nm and a variation coefficient of the particle size was 7.4%, and 5.0% by mass water dispersion (dispersion liquid) of spherical colloidal silica in which an average particle size $\Lambda 3$ was 90.2 nm and a variation coefficient of the particle size was 9.4% were prepared. In addition, the average particle size and the variation coefficient of the particle size were obtained from peaks obtained by fitting a particle size distribution which was obtained by a particle dynamic scattering method using Zetasizer Nano-ZS manufactured by Malvern Instruments Ltd. to a Gauss curve.

Next, these three kinds of particle dispersion liquids were filtered using a membrane filter having a hole diameter of 1.2 μmϕ, and the three kinds of particle dispersion liquids that passes through the membrane filter were mixed. A mixing ratio of the respective particle dispersion liquids was adjusted to obtain an occupied area ratio of 1:1:1.

The occupied area ratio is a ratio of total areas on a substrate occupied by particles having respective average particle sizes when all of the particles contained in the respective water dispersions were deposited on the substrate in a single layer. The occupied area ratio was obtained by the following method.

First, a diameter range of a particle mixture which was measured by the AFM method was partitioned for each 20 nm, and a frequency (%) was obtained from the number of particles having a particle size corresponding to each section. From a median value of the particle size in each section and the frequency (%) of particles present in each section, an area ratio (%) of particles present in each section was calculated by Expression: $\pi \times (\text{the median value}/2)^2 \times \text{frequency}$. From the result, a histogram in which the particle size was shown in an X-axis (horizontal axis) and the area ratio of particles for each section was shown in a Y-axis (vertical axis) was created.

Next, a Gauss curve was fitted with respect to each of a plurality of peaks of the histogram. The sum of an area ratio of particles having a particle size in a range of a diameter of a peak top of each Gauss curve $\pm 2\sigma$ ($\sigma$ represents a standard deviation) was obtained. A ratio of sums of respective area ratios was set as an occupied area ratio.

Then, a hydrolysate aqueous solution of phenyltriethoxysilane having a concentration of 1.0% by mass was added to the mixed liquid of the three kinds of particle dispersion liquids, and reaction was allowed to occur at a temperature of approximately 40° C. for 3 hours. At this time, the mixed liquid of the dispersion liquids and the hydrolysate aqueous solution were mixed with each other in such a manner that the mass of phenyltriethoxysilane became 0.015 times the total mass of the three kinds of particles.

Next, methyl isobutyl ketone having a volume of 5 times the volume of the mixed solution of the dispersion liquids was added to the mixed liquid of the dispersion liquids after termination of the reaction and the resultant mixture was sufficiently stirred to carry out oil-phase extraction of the hydrophobized colloidal silica.

The hydrophobized colloidal silica dispersion liquid having a concentration of 1.05% by mass which was obtained in this manner was added dropwise onto a liquid surface (water was used as a lower layer water, and a water temperature was 23.2° C.) in a water tank (LB trough apparatus) provided with the surface pressure sensor that measures the surface pressure of a particle single layer film, and a movable barrier that compresses the particle single layer film in a direction along a liquid surface at a dropping speed of 0.01 ml/second. Then, methyl isobutyl ketone that was a solvent of the dispersion liquid was vaporized to form a particle single layer film. In addition, a quartz substrate (30 mm×30 mm×1.0 mm, both surfaces were mirror-polished) to be used as a transparent substrate of the organic light-emitting diode was immersed in advance in the lower layer water inside the water tank in an approximately vertical direction.

Next, the particle single layer film was compressed by the movable barrier until a diffusion pressure reached 22 mNm$^{-1}$ to 30 mNm$^{-1}$, and then the quartz substrate was drawn up at a speed of 3 mm/minute to move the particle single layer film on the water surface onto one surface of the substrate.

Next, a hydrolysis liquid of 0.15% by mass monomethyl-trimethoxysilane as a binder was allowed to penetrate through the surface of the quartz substrate on which the particle single layer film was formed, and then the surplus of the hydrolysis liquid was removed by a treatment using a spin coater (3000 rpm) for 1 minute. Then, the quartz substrate was heated at a temperature of 100° C. for 10 minutes to allow reaction of the binder to occur, thereby obtaining a quartz substrate to which the particle single layer film etching mask formed from colloidal silica was attached.

Next, with respect to the particle single layer film etching mask-attached quartz substrate that was obtained, dry etching was carried out using CHF$_3$ gas to obtain a quartz substrate with a concave-convex structure. Etching conditions were set as follows. Antenna power was set to 1500 W, bias power was set to 100 W (13.56 MHz), and a gas flow rate was set to 30 sccm.

Figure 4:
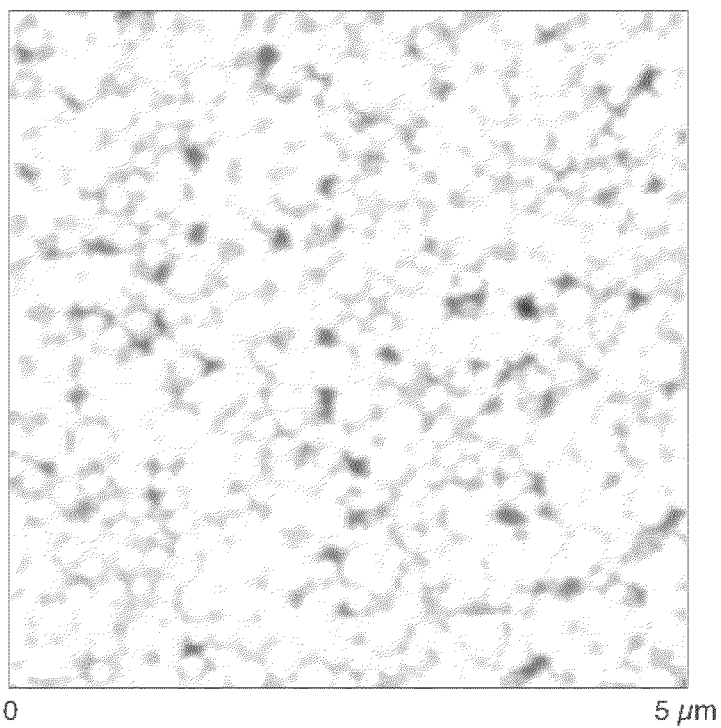
FIG. 4 is an atomic force microscope (AFM) image of the surface of a quartz substrate with a concave-convex structure which is prepared in Example 1.

The surface of the obtained quartz substrate with the concave-convex structure was observed by the atomic force microscope (AFM). An AFM image thereof is shown in FIG. 4. As shown in FIG. 4, three kinds of convex portions having diameters different from each other were randomly distributed in the surface of the quartz substrate with the concave-convex structure, and the shape of the respective convex portions was a truncated conical shape. In FIG. 4, bright portions are the top surfaces of the concave portions.

An average height of the concave-convex structure was obtained by the AFM, and an average height h1 of a convex portion corresponding to the particles having the average particle size Λ1, an average height h2 of a convex portion corresponding to the particles having the average particle size Λ2, and an average height h3 of a convex portion corresponding to the particles having the average particle size Λ3 were 30.5 nm, 31.1 nm, and 29.2 nm, respectively, and an average height of the entirety was 30.3 nm.

As the positive electrode conductive layer, IZO was formed in a thickness of 50 nm on a concave-convex structure surface side of the quartz substrate with the concave-convex structure by a sputtering method.

Next, as a hole injection material, 2-TNATA was formed in a thickness of 30 nm according to a deposition method to form a hole injection layer.

Next, as a hole transport material, α-NPD was formed in a thickness of 70 nm according to a deposition method to form a hole transport layer.

Next, as an electron migration and light-emitting layers, a multi-layer film having a three-layer structure was formed in the following order. That is, a red light-emitting material obtained by doping Alq with coumarin C545T in a concentration of 1.0% was formed in a thickness of 5 nm on the hole transport layer according to a deposition method. Next, a green light-emitting material obtained by doping a conductive material (PH1) with Ir(piq)$_3$ in a concentration of 5.0% was formed in a thickness of 20 nm according to a deposition method. Next, a blue light-emitting material obtained by doping DPVBi with BcZVBi in a concentration of 5.0% was formed in a thickness of 30 nm according to a deposition method.

Next, as an electron transport material, Alq was formed in a thickness of 20 nm according to a deposition method to form an electron transport layer. Further, as an electron injection layer, LiF was formed in a thickness of 0.6 nm according to a deposition method.

Finally, aluminum was formed in a thickness of 150 nm according to a deposition method to form a negative electrode conductive layer, whereby a bottom emission type white organic light-emitting diode element was completed. A light-emitting area was prepared in 2 mm×2 mm by using a shadow mask for deposition.

Example 2

The surface of the quartz substrate was coated with the mixed particles to prepare a quartz substrate with a concave-convex structure by the same operation as Example 1 except that spherical colloidal silica in which the average particle size Λ1 was 301.3 nm and the variation coefficient of the particle size was 3.2%, spherical colloidal silica in which the average particle size Λ2 was 202.5 nm and the variation coefficient of the particle size was 4.6%, and spherical colloidal silica in which the average particle size Λ3 was 90.2 nm and the variation coefficient of the particle size was 9.4% were mixed with each other to obtain the occupied area ratio of 1:1:1, and the resultant mixture was used. The respective electrode layers and the EL layer which were configured with the same thickness and the same material as Example 1 were laminated, whereby a bottom emission type white organic light-emitting diode was completed.

Example 3

The surface of the quartz substrate was coated with the mixed particles to prepare a quartz substrate with a concave-convex structure by the same operation as Example 1 except that spherical colloidal silica in which the average particle size Λ1 was 150.1 nm and the variation coefficient of the particle size was 7.4%, and spherical colloidal silica in which the average particle size Λ2 was 90.2 nm and the variation coefficient of the particle size was 9.4% were mixed with each other to obtain the occupied area ratio of 1:1, and the resultant mixture was used. The respective electrode layers and the EL layer which were configured with the same thickness and the same material as Example 1 were laminated, whereby a bottom emission type white organic light-emitting diode was completed.

Example 4

The surface of the quartz substrate was coated with the mixed particles to prepare a quartz substrate with a concave-convex structure by the same operation as Example 1 except that spherical colloidal silica in which the average particle size Λ1 was 202.5 nm and the variation coefficient of the particle size was 4.6%, and spherical colloidal silica in which the average particle size Λ2 was 90.2 nm and the variation coefficient of the particle size was 9.4% were mixed with each other to obtain the occupied area ratio of 1:1, and the resultant mixture was used. The respective electrode layers and the EL layer which were configured with the same thickness and the same material as Example 1 were laminated, whereby a bottom emission type white organic light-emitting diode was completed.

Example 5

The surface of the quartz substrate was coated with the mixed particles to prepare a quartz substrate with a concave-convex structure by the same operation as Example 1 except that spherical colloidal silica in which the average particle size Λ1 was 353.0 nm and the variation coefficient of the particle size was 3.2%, spherical colloidal silica in which the average particle size Λ2 was 250.6 nm and the variation coefficient of the particle size was 3.0%, and spherical colloidal silica in which the average particle size Λ3 was 202.5 nm and the variation coefficient of the particle size was 4.6% were mixed with each other to obtain the occupied area ratio of 1:1:1, and the resultant mixture was used. The respective electrode layers and the EL layer which were configured with the same thickness and the same material as Example 1 were laminated, whereby a bottom emission type white organic light-emitting diode was completed.

Example 6

The surface of the quartz substrate was coated with the mixed particles to prepare a quartz substrate with a concave-convex structure by the same operation as Example 1 except that spherical colloidal silica in which the average particle size Λ1 was 250.6 nm and the variation coefficient of the particle size was 3.0%, spherical colloidal silica in which the average particle size Λ2 was 202.5 nm and the variation coefficient of the particle size was 4.6%, and spherical colloidal silica in which the average particle size Λ3 was 90.2 nm and the variation coefficient of the particle size was 9.4% were mixed with each other to obtain the occupied area ratio of 1:1:1, and the resultant mixture was used. The respective electrode layers and the EL layer which were configured with the same thickness and the same material as Example 1 were laminated, whereby a bottom emission type white organic light-emitting diode was completed.

Example 7

The surface of the quartz substrate was coated with the mixed particles to prepare a quartz substrate with a concave-convex structure by the same operation as Example 1 except that spherical colloidal silica in which the average particle size Λ1 was 301.3 nm and the variation coefficient of the particle size was 3.2%, spherical colloidal silica in which the average particle size Λ2 was 250.6 nm and the variation coefficient of the particle size was 3.0%, spherical colloidal silica in which the average particle size Λ3 was 202.5 nm and the variation coefficient of the particle size was 4.6%, and spherical colloidal silica in which the average particle size Λ4 was 90.2 nm and the variation coefficient of the particle size was 9.4% were mixed with each other to obtain the occupied area ratio of 1:1:1:1, and the resultant mixture was used. The respective electrode layers and the EL layer which were configured with the same thickness and the same material as Example 1 were laminated, whereby a bottom emission type white organic light-emitting diode was completed.

Example 8

The surface of the quartz substrate was coated with the mixed particles to prepare a quartz substrate with a concave-convex structure by the same operation as Example 1 except that spherical colloidal silica in which the average particle size Λ1 was 202.5 nm and the variation coefficient of the particle size was 4.6%, spherical colloidal silica in which the average particle size Λ2 was 150.1 nm and the variation coefficient of the particle size was 7.4%, and spherical colloidal silica in which the average particle size Λ3 was 90.2 nm and the variation coefficient of the particle size was 9.4% were mixed with each other to obtain the occupied area ratio of 1:1:1, and the resultant mixture was used. The respective electrode layers and the EL layer which were configured with the same thickness and the same material as Example 1 were laminated, whereby a bottom emission type white organic light-emitting diode was completed.

Comparative Example 1

The respective electrode layers and the EL layer which were configured with the same thickness and the same material as Example 1 were laminated by the same operation as Example 1 except that the concave-convex structure was not formed in the surface of the quartz substrate, whereby a bottom emission type white organic light-emitting diode was completed.

Comparative Example 2

The surface of the quartz substrate was coated with the mixed particles to prepare a quartz substrate with a concave-convex structure by the same operation as Example 1 except that spherical colloidal silica in which the average particle size Λ1 was 250.6 nm and the variation coefficient of the particle size was 3.0%, spherical colloidal silica in which the average particle size Λ2 was 202.5 nm and the variation coefficient of the particle size was 4.6%, and spherical colloidal silica in which the average particle size Λ3 was 150.1 nm and the variation coefficient of the particle size was 7.4% were mixed with each other to obtain the occupied area ratio of 1:2:1, and the resultant mixture was used. The respective electrode layers and EL layer which were configured with the same thickness and the same material as Example 1 were laminated, whereby a bottom emission type white organic light-emitting diode was completed.

Evaluation of Current Efficiency Characteristics and Power Efficiency Characteristics With respect to the white organic light-emitting diodes that were obtained in Examples 1 to 8 and Comparative Examples 1 and 2, current efficiency characteristics and power efficiency characteristics were evaluated by the following sequence. Results are shown in Table 1.

Luminance ($cd/m^2$) in a perpendicular direction when allowing the white organic light-emitting diodes to emit light at a current density of 12.5 $mA/m^2$ was measured by a luminance meter to obtain current efficiency per current density (current density ($mA/m^2$)–current efficiency (cd/A) per current density). In addition, a voltage when measuring the luminance was measured, and a luminous flux (lm) was converted from the luminance to obtain power efficiency per current density (current density ($mA/m^2$)–power efficiency (lm/W)).

From these measurement results, with respect to the respective current efficiency and power efficiency per current density, improvement rates of measured values of Examples 1 to 8 and Comparative Example 1 and 2 with respect to a measured value (blank) of Comparative Example 1 were calculated by the following Expression.

Improvement rate=(Measured values of Examples 1 to 8 and Comparative Examples 1 and 2)/measured value of Comparative Example 1

Evaluation of Chromaticity of Light-Emitting Surface

Chromaticity of the light-emitting surface of the elements prepared in Examples and Comparative Examples was obtained using a spectroscopic colorimeter SE-6000 manufactured by NIPPON DENSHOKU INDUSTRIES Co., LTD as chromaticity coordinates (x, y) in CIE standard colorimetric system. Results are shown in Table 1.

TABLE 1

|  | Occupied area ratio (φ/nm) = ratio | Chromaticity (x, y) | Current efficiency-current density characteristics | | Power efficiency-current density characteristics | |
|---|---|---|---|---|---|---|
|  |  |  | cd/A (@12.5 mA/cm²) | Improvement rate with respect to blank (times) | cd/A (@125 mA/cm²) | Improvement rate with respect to blank (times) |
| Example 1 | 250:150:90 = 1:1:1 [a = 250, b = 90, a/b ≅ 2.78] | 0.34, 0.31 | 1.03 | 3.43 | 0.34 | 3.78 |
| Example 2 | 300:200:90 = 1:1:1 [a = 300, b = 90, a/b ≅ 3.33] | 0.35, 0.31 | 0.98 | 3.27 | 0.33 | 3.67 |
| Example 3 | 150:90 = 1:1 [a = 150, b = 90, a/b ≅ 1.67] | 0.35, 0.31 | 0.97 | 3.23 | 0.31 | 3.44 |
| Example 4 | 200:90 = 1:1 [a = 200, b = 90, a/b ≅ 2.22] | 0.37, 0.33 | 0.96 | 3.20 | 0.31 | 3.44 |
| Example 5 | 350:250:200 = 1:1:1 [a = 350, b = 200, a/b ≅ 1.75] | 0.35, 0.33 | 0.80 | 2.67 | 0.26 | 2.89 |
| Example 6 | 250:200:90 = 1:1:1 [a = 250, b = 90, a/b ≅ 2.78] | 0.34, 0.31 | 0.77 | 2.57 | 0.24 | 2.67 |
| Example 7 | 300:250:200:90 = 1:1:1:1 [a = 300, b = 90, a/b ≅ 3.33] | 0.34, 0.30 | 0.70 | 2.33 | 0.24 | 2.67 |
| Example 8 | 200:150:90 = 1:1:1 [a = 200, b = 90, a/b ≅ 2.22] | 0.33, 0.31 | 0.71 | 2.37 | 0.23 | 2.56 |
| Comparative Example 1 | Flat substrate | 0.33, 0.33 | 0.30 | 1.00 | 0.09 | 1.00 |
| Comparative Example 2 | 250:200:150 = 1:2:1 [a = 250, b = 150, a/b ≅ 1.67] | 0.22, 0.22 | 0.35 | 1.17 | 0.11 | 1.22 |

The improvement rate of the current efficiency per current density (current density (mA/m²) vs luminance (cd/A)) of Examples 1 to 8 was 2.33 to 3.43 times Comparative Example 1, and the power efficiency per current density (current density (mA/m²) vs power efficiency (lm/W)) was 2.56 to 3.78 times Comparative Example 1.

On the other hand, in Comparative Example 2 in which the occupied area ratio was 250 nm:200 nm:150 nm=1:2:1 and an occupied area of particles of 200 nm exceeded a value of an average value+30%, the improvement rate of the current efficiency per current density was as low as 1.17 times Comparative Example 1, the power efficiency per current density was as low as 1.22 times Comparative Example 1, and the extraction efficiency was not high. In addition, the chromaticity coordinates deviated from a range of (x, y)=(0.28 to 0.50, 0.29 to 0.45), and significantly deviated from a white point (0.3, 0.3). The significant deviation of the chromaticity has the following meaning. Since a plasmonic lattice cannot be extracted only in a partial wavelength region of a white light spectrum, entire color balance collapses.

From the above-described result, in the white organic light-emitting diodes obtained in Examples 1 to 8, it could be seen that light-emission intensity greatly increased as in comparison to Comparative Example 1, and all of the power efficiency and the current efficiency were greatly improved. In addition, a variation in a color tone of light that was emitted was less as in comparison to Comparative Example 2 and thus satisfactory white light was obtained.

What is claimed is:

1. An organic light-emitting diode comprising an organic light-emitting diode substrate in which a concave-convex structure is provided in at least a part of a surface, wherein the concave-convex structure is capable of obtaining an atomic force microscope image in which a plurality of dots are dispersed when observed by an atomic force microscope,
   wherein the concave-convex structure of the organic light-emitting diode substrate is defined by the configuration of a histogram created by a process comprising:
      measuring a diameter of each of the plurality of dots present in a randomly selected region having an area of 25 μm² on the atomic force microscope image;
      obtaining a frequency distribution from a number of dots having a diameter corresponding to each of sections obtained by partitioning a diameter range for each 20 nm;
      calculating a total area of dots, which are present in each of the sections from the frequency distribution; and
      creating the histogram in which the total area is shown in a Y-axis and the diameter of the dot is shown in an X-axis, the histogram has a plurality of peaks,
   wherein the plurality of peaks comprise one main peak in which a total area of dots corresponding to a corresponding peak has a maximum value, and one or more sub-peaks in which the total area is 10% or more of the maximum value, and wherein
   the chromaticity of light emitted from the organic light-emitting diode is in a range of chromaticity coordinates (x, y)=(0.28 to 0.50, 0.29 to 0.45) in a CIE standard colorimetric system.

2. The organic light-emitting diode according to claim 1, wherein among diameters of the respective main peak and sub-peaks, when a maximum diameter is set as A and a minimum diameter is set as B, 1.2B≤A≤4B; 100 nm≤A≤500 nm; and 30 nm≤B≤300 nm.

3. An organic light-emitting diode substrate in which a concave-convex structure is provided in at least a part of a surface, wherein the concave-convex structure is capable of obtaining an atomic force microscope image in which a plurality of dots are dispersed when observed by an atomic force microscope,
   wherein the concave-convex structure of the organic light-emitting diode substrate is defined by the configuration of a histogram created by a process comprising:
      measuring a diameter of each of the plurality of dots present in a randomly selected region having an area of 25 μm² on the atomic force microscope image;
      obtaining a frequency distribution from a number of dots having a diameter corresponding to each of sections obtained by partitioning a diameter range for each 20 nm;
      calculating a total area of dots, which are present in each of the sections from the frequency distribution; and creating the histogram in which the total area is shown in a Y-axis and the diameter of the dot is shown in an X-axis, the histogram has a plurality of peaks,
wherein the plurality of peaks comprise one main peak in which a total area of dots corresponding to a corresponding peak has a maximum value, and one or more sub-peaks in which the total area is 10% or more of the maximum value.

4. A method of manufacturing an organic light-emitting diode substrate according to claim 3, the method comprising:
obtaining a particle mixture in which a particle size distribution has a plurality of peaks;
disposing a particle single layer film formed from the particle mixture on at least a part of the surface of the substrate; and
dry-etching the substrate by using the particle single layer film as an etching mask to form a concave-convex structure in at least a part of a surface of the substrate.

5. The method of manufacturing an organic light-emitting diode substrate according to claim 4, wherein among particle sizes of the respective main peak and sub-peaks, when a maximum particle size is set as a and a minimum particle size is set as b, $1.2b \leq a \leq 4b$; $100\ nm \leq a \leq 500\ nm$; and $30\ nm \leq b \leq 300\ nm$.

6. An organic light-emitting diode, comprising the organic light-emitting diode substrate manufactured according to the method of claim 5.

7. An organic light-emitting diode, comprising the organic light-emitting diode substrate manufactured according to the method of claim 4.

8. A method of manufacturing an organic light-emitting diode substrate according to claim 3, the method comprising:
obtaining a particle mixture in which a particle size distribution has a plurality of peaks;
disposing a particle single layer film formed from the particle mixture on at least a part of the surface of a base material;
dry-etching the base material by using the particle single layer film as an etching mask to form a concave-convex structure in at least a part of the surface of the base material; and
transferring the concave-convex structure or a concave-convex structure which is formed by transferring the concave-convex structure onto another base material onto at least a part of the surface of the substrate.

9. The method of manufacturing an organic light-emitting diode substrate according to claim 8, wherein among particle sizes of the respective main peak and sub-peaks, when a maximum particle size is set as a and a minimum particle size is set as b, $1.2b \leq a \leq 4b$; $100\ nm \leq a \leq 500\ nm$; and $30\ nm \leq b \leq 300\ nm$.

10. An organic light-emitting diode, comprising the organic light-emitting diode substrate manufactured according to the method of claim 9.

11. An organic light-emitting diode, comprising the organic light-emitting diode substrate manufactured according to the method of claim 8.

* * * * *